(12) United States Patent
Naone et al.

(10) Patent No.: US 7,020,172 B2
(45) Date of Patent: Mar. 28, 2006

(54) LONG WAVELENGTH VERTICAL CAVITY SURFACE EMITTING LASER

(75) Inventors: Ryan Likeke Naone, Boulder, CO (US); Andrew W. Jackson, Boulder, CO (US); Leo M. F. Chirovsky, Superior, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 29 days.

(21) Appl. No.: 10/842,617

(22) Filed: May 10, 2004

(65) Prior Publication Data

US 2004/0208216 A1    Oct. 21, 2004

Related U.S. Application Data

(63) Continuation of application No. 10/122,707, filed on Apr. 11, 2002, now Pat. No. 6,898,215.

(60) Provisional application No. 60/283,449, filed on Apr. 11, 2001, provisional application No. 60/284,485, filed on Apr. 17, 2001, provisional application No. 60/355,240, filed on Feb. 8, 2002.

(51) Int. Cl.
*H01S 5/00*    (2006.01)
(52) U.S. Cl. .............. 372/43.01; 372/50.124; 372/50.11; 372/50.01; 372/44.01; 372/92
(58) Field of Classification Search ............ 372/50.11, 372/92, 50.124, 96, 43.01, 99, 44.01, 50.1, 372/44.1
See application file for complete search history.

(56) References Cited

U.S. PATENT DOCUMENTS

| | | | |
|---|---|---|---|
| 4,908,686 A | 3/1990 | Maserjian | 357/30 |
| 5,245,622 A | 9/1993 | Jewell et al. | 372/45 |
| 5,424,559 A | 6/1995 | Kasahara | 257/21 |
| 5,513,204 A | 4/1996 | Jayaraman | 372/96 |
| 5,557,627 A | 9/1996 | Schneider, Jr. et al. | 372/46 |
| 5,606,572 A | 2/1997 | Swirhun et al. | 372/96 |
| 5,719,894 A | 2/1998 | Jewell et al. | 372/45 |
| 5,719,895 A | 2/1998 | Jewell et al. | 372/45 |
| 5,805,624 A | 9/1998 | Yang et al. | 372/45 |
| 5,825,796 A | 10/1998 | Jewell et al. | 372/45 |
| 5,903,589 A | 5/1999 | Jewell | 372/46 |

(Continued)

FOREIGN PATENT DOCUMENTS

EP    0 822 630 A1    2/1998

(Continued)

OTHER PUBLICATIONS

Lear K L et al,"High-frequency modulation of oxide-confided vertical cavity surface emitting lasers" Electronics Letter IEE Stevenage, GB, vol. 32, No. 5, Feb. 29, 1996, pp. 457-458.

(Continued)

*Primary Examiner*—Minsun Oh Harvey
*Assistant Examiner*—Delma R. Flores-Ruiz
(74) *Attorney, Agent, or Firm*—Barlow, Josephs & Holmes, Ltd.

(57) ABSTRACT

Selectively oxidized vertical cavity lasers emitting at about 1290 nm using InGaAsN quantum wells that operate continuous wave below, at and above room temperature are reported. The lasers employ a semi-insulating GaAs substrate for reduced capacitance, high quality, low resistivity AlGaAs DBR mirror structures, and a strained active region based on InGaAsN. In addition, the design of the VCSEL reduces free carrier absorption of 1.3 μm light in the p-type materials by placing relatively higher p-type dopant concentrations near standing wave nulls.

24 Claims, 28 Drawing Sheets

U.S. PATENT DOCUMENTS

| | | | |
|---|---|---|---|
| 5,912,913 A | 6/1999 | Kondow et al. | 372/45 |
| 5,936,266 A | 8/1999 | Holonyak, Jr. et al. | 257/106 |
| 5,960,018 A | 9/1999 | Jewell et al. | 372/45 |
| 6,014,395 A | 1/2000 | Jewell | 372/45 |
| 6,052,398 A | 4/2000 | Brillouet et al. | 372/46 |
| 6,207,973 B1* | 3/2001 | Sato et al. | 257/98 |
| 6,570,905 B1* | 5/2003 | Ebeling | 372/96 |
| 6,657,233 B1* | 12/2003 | Sato et al. | 257/79 |
| 6,810,065 B1* | 10/2004 | Naone | 372/96 |
| 6,898,215 B1* | 5/2005 | Naone et al. | 372/4 |
| 2001/0050934 A1* | 12/2001 | Choquette et al. | 372/43 |
| 2002/0150135 A1 | 10/2002 | Naone et al. | 372/45 |
| 2003/0123513 A1* | 7/2003 | Villareal et al. | 372/96 |
| 2004/0076209 A1* | 4/2004 | Bour et al. | 372/45 |
| 2004/0095978 A1* | 5/2004 | Cheng et al. | 372/45 |
| 2004/0151221 A1* | 8/2004 | Yamamoto et al. | 372/32 |
| 2004/0208216 A1* | 10/2004 | Naone et al. | 372/45 |

FOREIGN PATENT DOCUMENTS

| | | |
|---|---|---|
| JP | HEI 7 1995-154023 | 6/1995 |
| WO | WO 98/07218 | 2/1998 |
| WO | WO 02/084829 A1 | 10/2002 |

OTHER PUBLICATIONS

Ohnoki N et al,"Super-lattice AlAs/AlInAs for lateral-oxide current confinement in InP-based lasers" Journal of Crystal Growth, North-Holland Publishing Co. Amsterdam NL,vol. 195, No. 1-4, Dec. 15, 1998,pp. 603-608.

J Boucart et al.,1-m W CW-RT Monolithic VCSEL at 1.55 µm,IEEE Photonics Technology Letters, Jun. 1999,pp 629-631,vol. II, No. 6.

Shiro Sakai et al,Band Gap Energy and Band Lineup of III-V Alloy Semiconductors incorporating Nitrogen and Boron, Jpn.J.Appl.Phys.,Oct. 1993,pp 4413-4416,vol. 32 Part 1,No. 10.

M Kondow et al,Gas-Source molecular Beam Epitaxy of $GaN_xAs_{1-x}$Using a N Radical as the N Source, Jpn.J.Appl. Phys.,Aug. 1994,pp. 1056-1058,vol. 33,Part 2,No. 8A.

M Kondow et al.,Room-Temperature Pulsed Operation of GaInN as Laser Diodes with Excellent High-Temperature Performance,Jpn. J.Appl,Phys.,Nov. 1996,pp. 5711-5713, vol. 35,Pt. 1,No. 11.

Winston,et al,"Optoelectronic Device Simulation of Bragg Reflectors and Their Influence on Surface Emitting Laser Characteristics", Dept. of Electrical and Computer . . . Engineering and the Optoelectronic Computer Systems Center University of Colorado, Boulder, CO 80309-0425, pp. 1-17 and 22-34.

Schneider, Jr. et al., "Epitaxy of Vertical-Cavity Lasers, In Vertical-Cavity Surface-Emitting Lasers", edited by C. Wilmsen et al., 1999,pp 137-139,Cambridge,UK; Cambridge University Press.

* cited by examiner

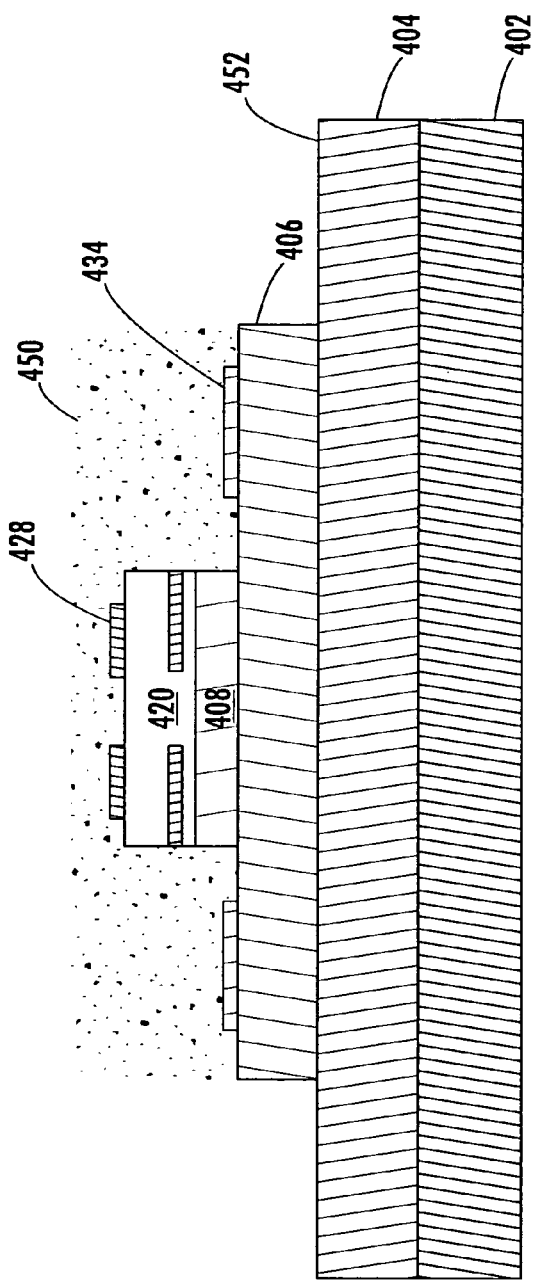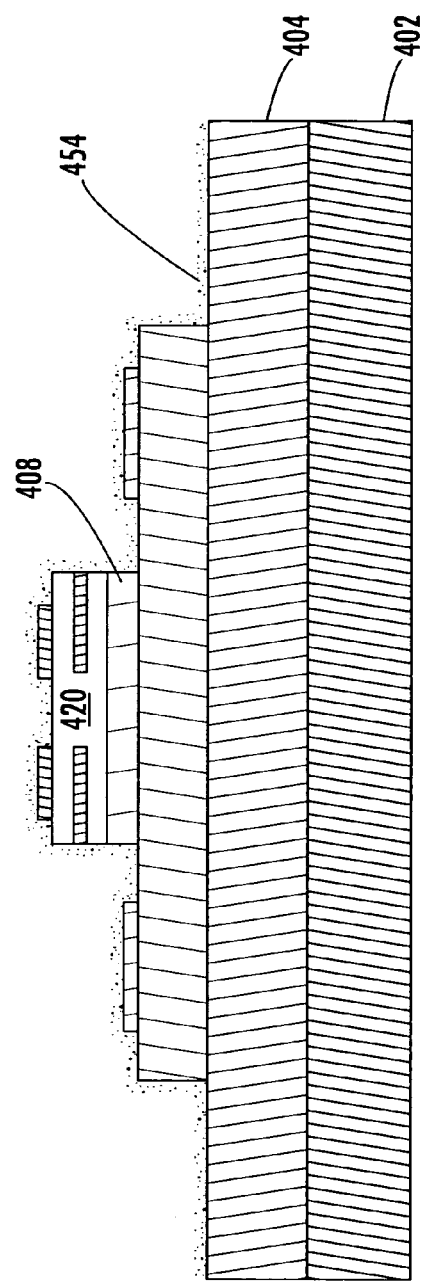
FIG. 7E
FIG. 7F

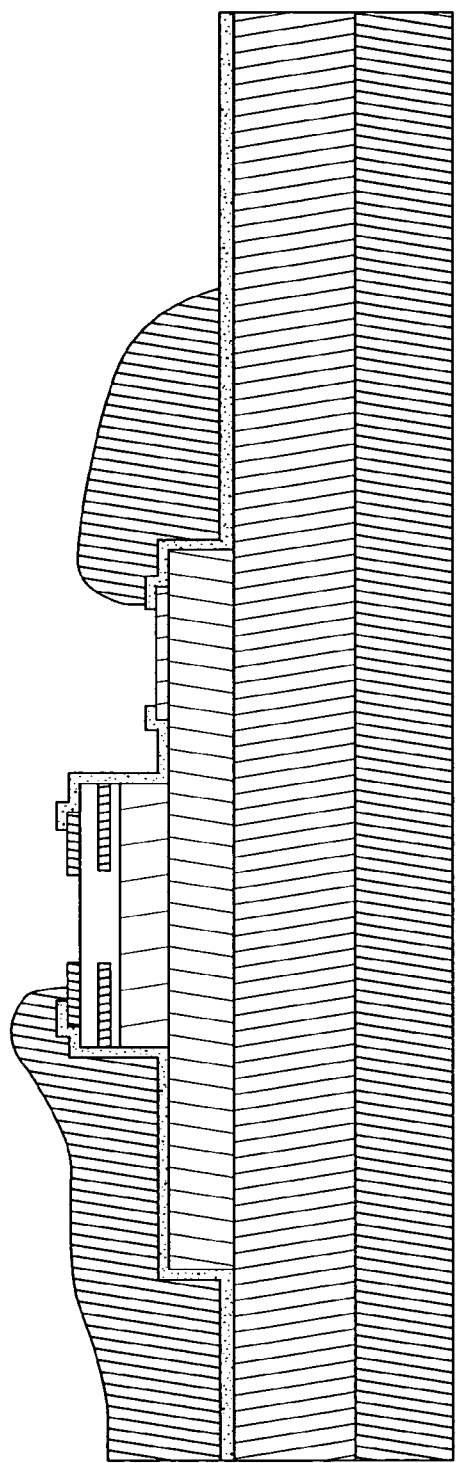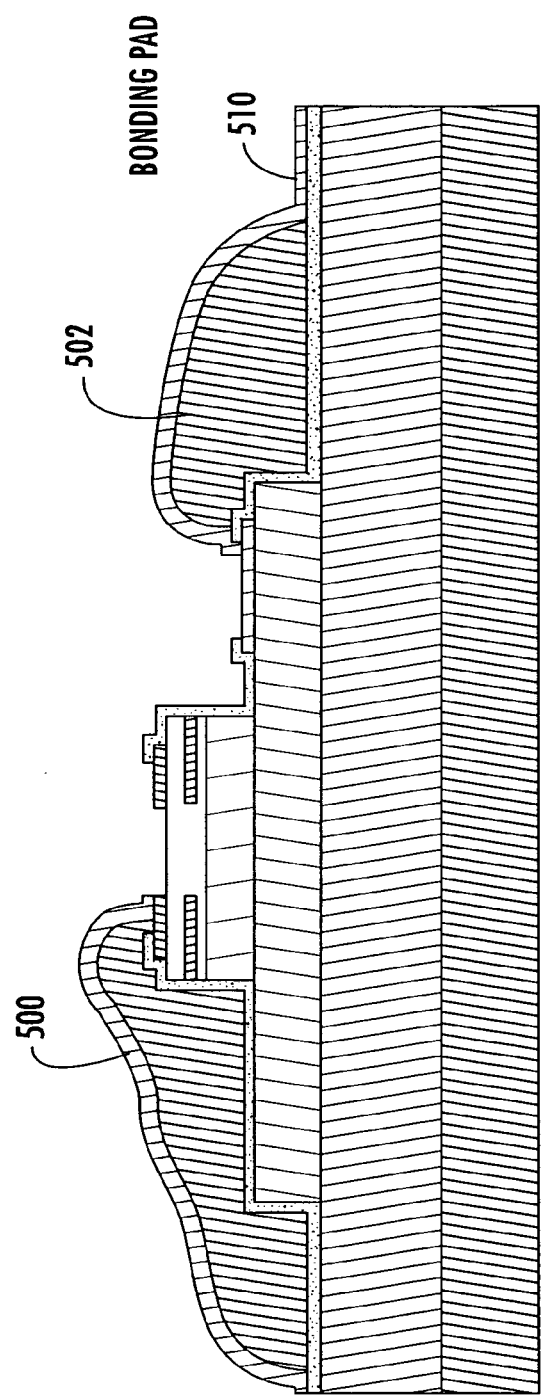

LONG WAVELENGTH VERTICAL CAVITY SURFACE EMITTING LASER

CROSS REFERENCE TO RELATED APPLICATIONS

This application claims priority to U.S. Provisional Patent application Ser. No. 60/283,449, entitled "LONG WAVELENGTH VERTICAL CAVITY SURFACE EMITTING LASER" filed on Apr. 11, 2001 and U.S. Provisional application Ser. No. 60/284,485, entitled "LONG WAVELENGTH SURFACE EMITTING LASER ARRAY", filed on Apr. 17, 2001, and U.S. Provisional Patent application Ser. No. 60/355,240, entitled "LONG WAVELENGTH VERTICAL CAVITY SURFACE EMITTING LASER", filed Feb. 8, 2002 the contents of all of which is incorporated herein by reference. This application is a continuation of U.S. patent application Ser. No. 10/122,707 entitled "LONG WAVELENGTH VERTICAL CAVITY SURFACE EMITTING LASER" filed Apr. 11, 2002 U.S. Pat. No. 6,898,215.

FIELD OF THE INVENTION

The present invention relates generally to vertical cavity surface emitting lasers ("VCSELs"), and more particularly, to VCSELs that emit light at a nominal wavelength of 1.3 µm or higher.

BACKGROUND

Vertical cavity surface emitting lasers (VCSELs) emitting at 850 nm have been widely and rapidly adopted into Gigabit Ethernet and other applications. Short wavelength VCSELs are particularly suitable for multi-mode optical fiber local area networks due to their reliability, reduced threshold current, circular output beam, and inexpensive and high volume manufacture. However, there is strong interest in developing VCSELs that emit at long wavelengths, such as in the 1240 nm to 1600 nm regime. VCSELs that emit at 1.3 µm, for example, may be used to leverage high bandwidth single mode fiber that is often already installed as well as to operate at the dispersion minimum of silica optical fiber.

SUMMARY OF THE INVENTION

An exemplary embodiment of the present invention provides a VCSEL that is suitable for high speed optical communications at a nominal wavelength of 1.3 µm (and longer) and transmission speeds up to 10 Gb/s over distances of up to 20 km or more. The VCSEL is fabricated on a GaAs substrate, utilizes high quality AlGaAs DBR mirror structures, and a strained active region based on InGaAsN.

In addition, the design of the VCSEL reduces free carrier absorption of 1.3 µm light in the p-type materials by placing relatively higher p-type dopant concentrations near standing wave nulls. Furthermore, in certain variations of the VCSEL, improvements may be used to reduce the device resistance that is inherent in current approaches to 1.3 µm VCSELs. In addition, a linear array of VCSEL devices may be formed that provides substantially uniform light output at a given current and temperature. An exemplary VCSEL array may therefore be integrated into parallel optical links using standard MTP parallel connectors.

In one aspect of the present invention a vertical cavity surface emitting laser includes an undoped first mirror adjacent a semi-insulating substrate, an optical cavity, comprising an active region having one or more $In_xGa_{1-x}As_yN_{1-y}$ quantum wells, adjacent the first mirror, a p-type second mirror adjacent the optical cavity, a p-type ohmic contact above the optical cavity and an n-type intra-cavity contact below the optical cavity.

In another aspect of the present invention a vertical cavity surface emitting laser includes an n-type mirror comprising alternating layers of a first semiconductor material having a first index of refraction and a second semiconductor material having a second index of refraction greater than the first index of refraction and a step graded interfacial transition layer there between, an optical cavity comprising an active region having one or more $In_xGa_{1-x}As_yN_{1-y}$ quantum wells adjacent the n-type mirror and a second mirror adjacent the optical cavity.

In a further aspect of the present invention a vertical cavity surface emitting laser includes an undoped first mirror stack adjacent a semi-insulating substrate, an optical cavity, comprising an active region having one or more $In_xGa_{1-x}As_yN_{1-y}$ quantum wells, adjacent the first mirror stack, a p-type intra-cavity contact adjacent the optical cavity, a dielectric mirror adjacent the optical cavity and p-type intra-cavity contact and an n-type intra-cavity contact below the optical cavity.

In another aspect of the present invention an array of vertical cavity surface emitting lasers includes two or more vertical cavity lasers monolithically formed at discrete locations on a semi-insulating substrate, wherein each of the two or more vertical cavity surface emitting lasers comprise an undoped first mirror adjacent the semi-insulating substrate, an optical cavity, comprising an active region having one or more $In_xGa_{1-x}As_yN_{1-y}$ quantum wells, adjacent the undoped first mirror stack, a second mirror adjacent the optical cavity, a p-type ohmic contact above the optical cavity and an n-type intra-cavity contact below the optical cavity.

BRIEF DESCRIPTION OF THE DRAWINGS

These and other features, aspects, and advantages of the present invention will become better understood with regard to the following description, appended claims, and accompanying drawings, in which:

FIGS. 7A–7J are cross-sectional views illustrating an exemplary process for forming the VCSEL illustrated in FIG. 6 in accordance with an exemplary embodiment of the present invention;

FIG. 11 is a cross sectional view of an optical cavity including a cavity extension layer in accordance with an exemplary embodiment of the present invention;

DETAILED DESCRIPTION OF THE INVENTION

Figure 1:
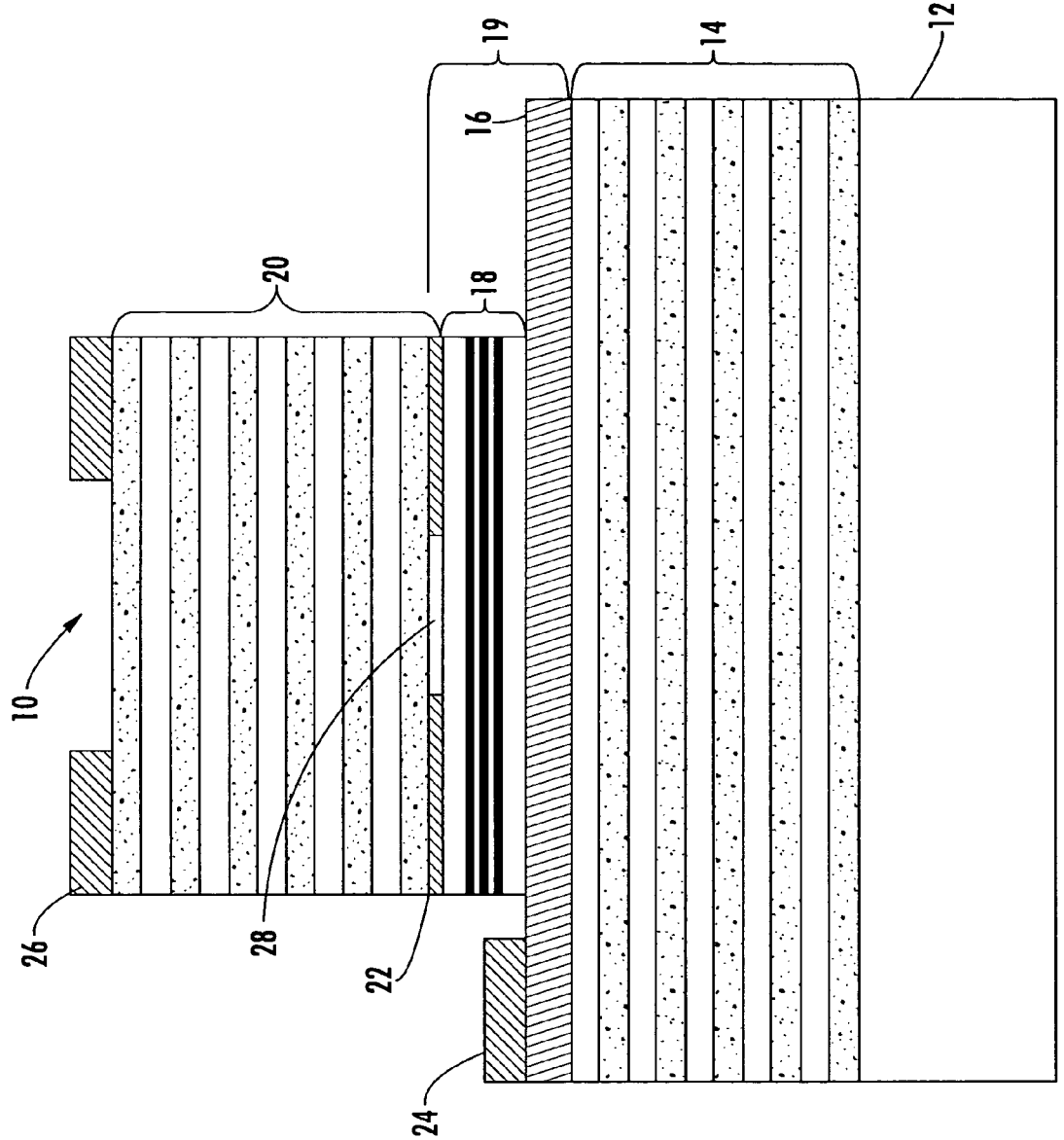
FIG. 1 is a cross-sectional view of an exemplary VCSEL structure in accordance with an exemplary embodiment of the present invention.

An exemplary embodiment of the present invention provides a high speed, continuous wave optoelectronic device that emits at a wavelength of 1200 nm and longer. An exemplary light emitting diode comprises a layered structure formed from Group III–V or II–VI compound semiconductor materials. In an exemplary embodiment the light emitting diode comprises a vertical cavity surface emitting laser (VCSEL) in which an optical cavity is normal to the p-n junction of the semiconductor wafer from which it was fabricated.

One of skill in the art will appreciate that the design of an efficient VCSEL for operation at a particular wavelength involves the balancing of a plurality of constraints. For example, conventional VCSEL designs rely on a relatively small active region volume within the optical cavity, to achieve a low threshold current. Small active regions however, have relatively low optical gain so that VCSELs typically require highly reflective optical mirrors above and below the optical cavity to achieve lasing. The upper and lower mirrors, often distributed Bragg reflectors (DBRs), may have their peak reflectivity at the emission wavelength of choice, e.g. 1310 nm or 1550 nm.

The production of VCSELs emitting at 1240–1600 nm wavelengths also requires laser quality active layer material that has strong light emission at a wavelength that is appropriate for device emission at the desired wavelength. Active layer materials for VCSELs that emit in the 1240 to 1600 nm region are presently the subject of intense research and development. For example, InGaAsP active layers have demonstrated excellent emission strength in the 1240–1600 nm region. However, InGaAsP has a lattice constant that is more closely matched to InP than to other binary III–V semiconductor substrates, for example, GaAs. Thus, many of the lasers emitting at 1240–1600 nm to date have been grown on InP substrates to minimize defects that may degrade the light emission performance or reliability of the device.

However, DBRs formed from the InP based material systems typically have a relatively low index contrast. Therefore, a very large number of layer pairs, up to sixty periods, may be required to construct InP based DBRs with sufficient reflectivity. Disadvantageously, if a large number of pairs is used in the DBR it becomes difficult to manufacture the mirror and, moreover, the yield of the device deteriorates. In addition, device resistance and power consumption also increase with increasing number of mirror periods. In addition, the thermal conductivity of InP based DBR mirrors is relatively poor, resulting in devices with poor thermal properties.

Alternatively, high quality DBR mirrors that have a peak reflectivity at long wavelengths such as, for example, 1310 nm and 1550 nm may be constructed using an AlGaAs system grown on a GaAs substrate. However, until recently a suitable high quality active layer material for use with the well-developed AlGaAs DBR technology that is lattice matched to a GaAs substrate has not been produced. As a result, it has been necessary to perform complicated processes such as wafer bonding to take advantage of both the high quality InGaAsP active layer and the high quality AlGaAs DBRS. However, the manufacture of such devices requires multiple complex steps, including as many as three epitaxial growths, so that such devices are not expected to be highly manufacturable.

More recently it has been shown that adding nitrogen to InGaAs, decreases the peak transition energy and thereby increases the peak transition wavelength as described by Kondow et al., in an article entitled "GaInNAs: A Novel Material for Long-Wavelength-Range Laser Diodes with Excellent High-Temperature Performance," Jpn. J. Appl. Phys., vol. 35, pp. 1273–1275, February 1996. In addition, Kondow et. al. have also shown that active layers formed from InGaAsN can be substantially lattice-matched to a GaAs substrate.

However, a unique challenge for long wavelength VCSELs relative to 850 nm VCSELs is that the optical absorption of the p-type doping required for a p-type DBR mirror may be as much as ten times higher in the 1240–1600 nm range. The magnitude of optical loss is further exaggerated for long wave devices by the fact that mirror layers are inherently thicker at longer wavelengths than shorter wavelengths. Thicker layers may also complicate the processing of such devices. For example, etch back processes for longwave devices may be more difficult to accurately control due to the increased depth of the etch.

Furthermore, the operating performance of a VCSEL (slope efficiency and threshold) typically varies as a function of temperature. However, certain variations of long wavelength VCSELs may suffer from excessive device resistance and self heating that decrease the efficiency of the device and limit the long term reliability of the device. Device resistance may result from voltage drops across the lower mirror, upper mirror or both.

Therefore, an exemplary embodiment of the present invention may include features to mitigate the impact of free carrier absorption in the p-type materials incorporated in a typical VCSEL. Furthermore, an exemplary embodiment of the present invention may further include additional features that reduce the device resistance which is inherent in current longwave VCSEL designs and to provide high speed, high power single mode operation.

Referring to FIG. 1, an exemplary light emitting device 10 is a layered structure epitaxially-grown on a semiconductor substrate. In the described exemplary embodiment, a lower mirror stack 14 is formed above a semi-insulating substrate 12, such as for example GaAs, and an n-type contact stack 16 may be formed above the lower mirror stack 14 and below an active region 18 in an optical cavity 19. Further, an upper mirror stack 20 may be formed above the optical cavity 19. In the described exemplary embodiment an oxide aperture 22 is formed between the active region 18 and the upper mirror stack 20, completing the optical cavity 19 (which also includes the n-type contact stack 16). The oxide aperture 22 may comprise, for example, a low index layer of AlGaAs that is selectively oxidized in part to provide electrical and optical confinement. In an exemplary embodiment of the present invention the VCSEL layers are etched downward to an upper surface of the n-type contact stack 16 forming a mesa to provide access to the oxidation layers used to form the oxide aperture 22 and the n-type contact stack 16.

In the described exemplary embodiment the VCSEL may be contacted with a p-type ohmic contact 26 formed above the upper mirror stack 20 and an n-type intracavity contact 24 formed below the active region 18. In one embodiment the p-type ohmic contact is deposited before the formation of the mesa and patterned by an etching or lift off step. In this embodiment the p-type ohmic contact 26 may either be protected by an overlying layer deposited and patterned for use as an etch mask, or the upper electrode may form at least a part of the etch mask. The p-type ohmic contact may be formed, for example, by depositing a p-type metalization, such as gold with 2% beryllium added or a layered structure of titanium/platinum above the upper mirror stack defining an annular opening therein by a lithographic masking and lift-off process. The p-type ohmic contact may be deposited for example, by electron beam evaporation. In one embodiment the n-type intra-cavity contact 24 may be formed, for example, by depositing an n-type metalization such as AuGe/Ni/Au on the upper surface of the n-type contact stack 16.

In an exemplary embodiment, the annular opening formed through the p-type ohmic contact 26 is generally sized to be at least as large in diameter as the oxide-free portion 28 of the oxide aperture 22, but smaller in diameter than the top surface of the mesa. In this way, light may be efficiently coupled out from the light-emitting device 10 through the central opening while allowing the electrical current to be efficiently coupled from the p-type ohmic contact 26 into the upper mirror stack 20, and therefrom to the active region 18.

Figure 2:
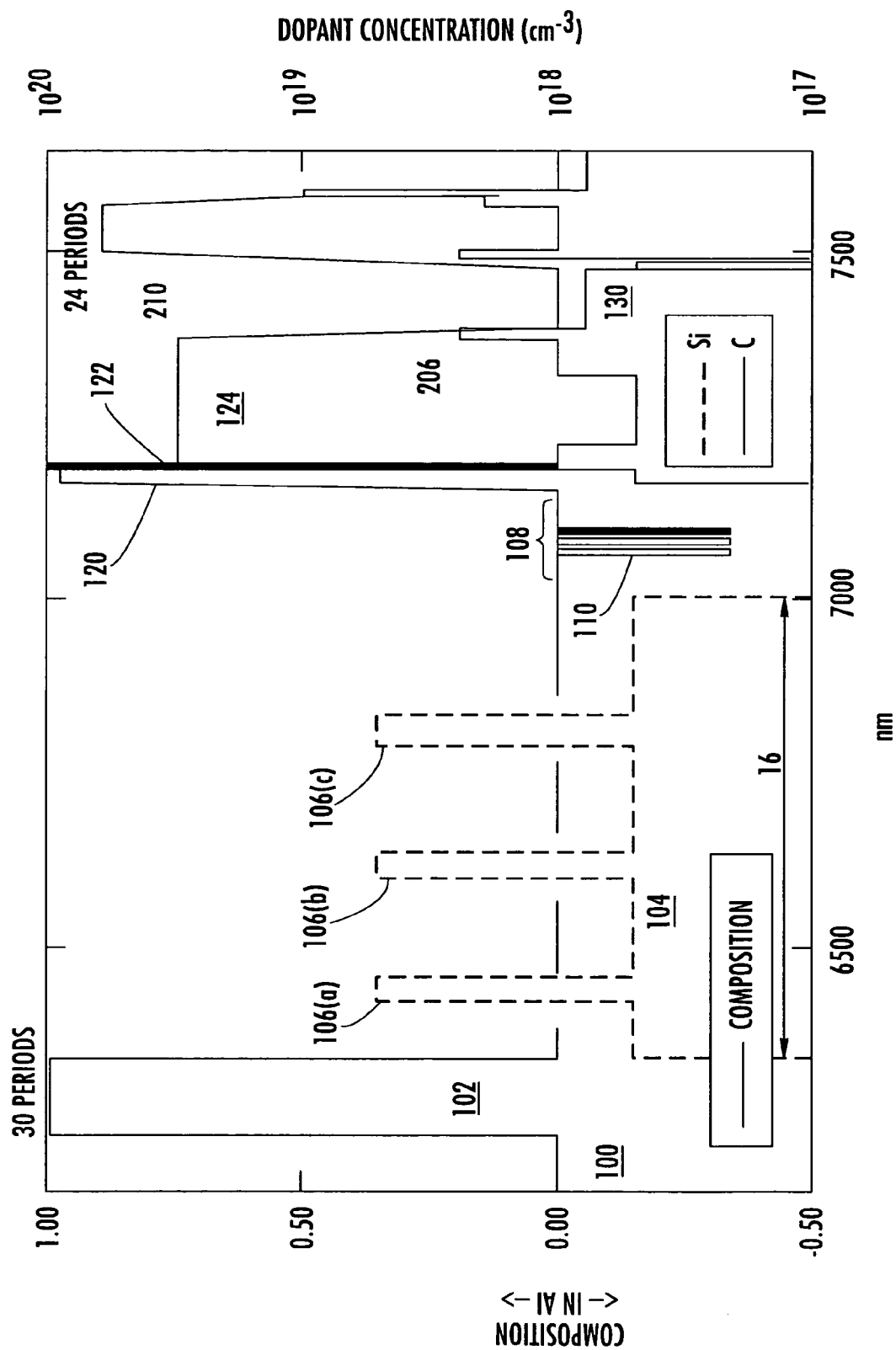
FIG. 2 graphically illustrates the alloy compositions and doping levels of the VCSEL of FIG. 1 including one period of the lower mirror stack adjacent the active region, through one period of the upper mirror stack in accordance with an exemplary embodiment of the present invention.

FIG. 2 graphically illustrates the alloy compositions and doping levels of the described exemplary light emitting device including the first period of the lower mirror stack adjacent to the active region, through the first period of the upper mirror stack adjacent to the oxide aperture. In an exemplary embodiment, the upper mirror stack may be formed from quarter-wavelength-thick alternating layers of AlGaAs/GaAs for operation at a wavelength near 1.3 μm. One of skill in the art will appreciate that the Al content in the AlGaAs upper mirror stack may vary in the range of about 0.8–0.96. Further, the upper limit of the Al fraction in the upper mirror stack may be determined by the Al composition of the alloy used to form the oxide aperture.

In the described exemplary embodiment the lower mirror stack may comprise alternating layers of un-doped binary pairs of AlAs 100 and GaAs 102 with abrupt interfaces at the layer edges. Advantageously, the utilization of binary pairs having a 100% concentration of Al reduces the overall thermal impedance of the lower mirror stack. In addition, the utilization of un-doped mirror pairs reduces the optical loss of the lower mirror stack as compared to conductive or doped mirror pairs.

In the described exemplary embodiment, the upper mirror stack is doped p-type. In an exemplary embodiment, the upper mirror stack may comprise on the order of twenty four mirror periods and the lower mirror stack may comprise on the order of thirty mirror periods. The upper and lower mirror stacks are highly reflective, having greater than 99% reflectivity. Conventionally, highly reflective DBRs have the disadvantage of being highly resistive with significant levels of self heating that may impair the performance of the device.

For example, the operating performance of a VCSEL (slope efficiency and threshold) typically varies as a function of temperature. In addition, long term laser reliability may also be compromised in high resistivity devices. Therefore, in the described exemplary embodiment, the upper and lower mirror stacks are designed to reduce the voltage drop as well as the loss or absorption associated with conducting current into the active region of the device.

For example, an exemplary embodiment of the present invention includes an n-type intra-cavity contact (See FIG. 1) for injecting electrons into the optical cavity. The efficiency of the described exemplary VCSEL is increased by having the n-type intra-cavity contact above the lower mirror stack, which reduces the series voltage across the VCSEL by avoiding conduction through the lower mirror stack. In one embodiment the n-type intra-cavity contact is coupled to the n-type contact stack 16. In an exemplary embodiment, the n-type contact stack 16 may comprise a GaAs layer doped with a suitable n-type dopant such as, for example, silicon. The n-type contact stack may include a constant doped region 104 with a concentration in the range of about $5 \times 10^{17}$ cm$^{-3}$. In addition, in an exemplary embodiment the n-type contact stack may further include one or more n-type doping spikes 106(a–c) having a concentration in the range of about $5 \times 10^{18}$ cm$^{-3}$ to reduce the lateral resistance created by the electrical connection.

Figure 3:
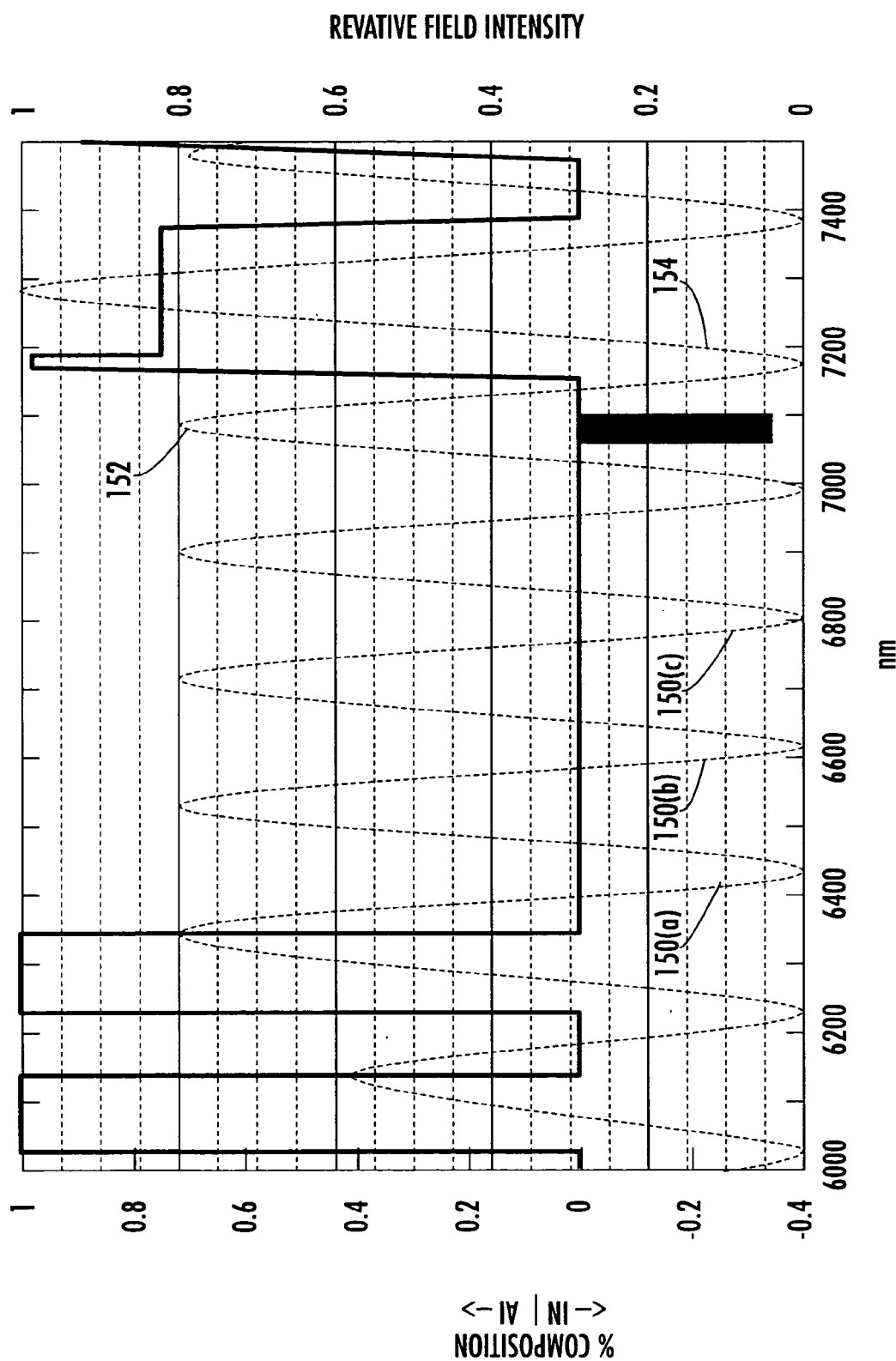
FIG. 3 graphically illustrates the alloy composition of that portion of the VCSEL structure shown in FIG. 2, overlayed with the standing wave intensity profile of the optical field as a function of vertical position within the VCSEL in accordance with an exemplary embodiment of the present invention.

FIG. 3 displays the alloy composition of that portion of the VCSEL structure shown in FIG. 2, overlayed with the standing wave intensity profile of the optical field as a function of vertical position within the VCSEL. The standing wave intensity profile is related to the intensity of the light in the VCSEL. Hence, the standing wave maxima are where the circulating light in the cavity is most intense, and the standing wave minima are where the light is least intense. Light is more readily absorbed by high doped semiconductor materials and less absorbed by low doped materials. Therefore, in the described exemplary embodiment, the heavily doped n-type spikes 106(a–c) in the n-type contact stack (see FIG. 2) may be positioned at a node or minimum 150(a–c) in the standing wave intensity pattern of the VCSEL structure to reduce the loss associated with these regions.

Referring back to FIG. 2, the optical cavity may include an active region 108 having one or more undoped $In_xGa_{1-x}As_yN_{1-y}$ quantum wells 110 (also known as active layers) separated by barrier layers and sandwiched between two carrier confinement layers or separate confinement heterostructures (SCHs). There are a variety of material compositions that may be utilized as the active layer within the active region. However, the proper selection of an active layer material preferably balances the gain requirements of the material with the mechanical stability of the device.

For example, increasing the indium concentration in the quantum wells tends to increase the emission wavelength but also increases the strain in the quantum well layers, thereby necessitating a reduction in quantum well thickness to avoid stress induced dislocations. However, reducing the well thickness also leads to a reduction in the emission wavelength due to increased quantum confinement. Furthermore, increasing the nitrogen concentration in the quantum well layers tends to increase the operating wavelength, and further provides strain compensation for the indium. Adding too much nitrogen, however, may reduce the optical quality of the active layer material.

Therefore, in an exemplary embodiment, the semiconductor alloy composition of the InGaAsN quantum wells may be optimized to achieve emission at a nominal wavelength of about 1.3 μm without exceeding the critical thickness of the quantum wells. In the described exemplary embodiment concentration of nitrogen within the quantum well layers is minimized to improve the optical quality of the material. It has been found that a nitrogen concentration of greater than 1% and less than about 2% provides substantially defect free, high optical quality material.

In an exemplary embodiment of the present invention the active region may comprise three $In_{0.34}Ga_{0.66}As_{0.988}N_{0.012}$ quantum wells. In the described exemplary embodiment each quantum well 110 may be in the range of about 3–10 nm thick. The quantum wells may be separated by barrier layers of undoped GaAs that are approximately eighty angstroms thick when separating a pair of adjacent quantum wells. In accordance with an exemplary embodiment the confinement layers may also be formed from GaAs and may be on the order of about one hundred fifty to five hundred angstroms thick. In the described exemplary embodiment the confinement layers are undoped to improve device reliability and to reduce optical loss and current spreading. However, one of skill in the art will appreciate that a portion of the confinement layers may be doped the same conductivity type as the adjacent semiconductor layers i.e. the lower confinement layer may be n-type and the upper confinement layer may be p-type in the described exemplary embodiment.

In the described exemplary embodiment, the barrier layers have an energy bandgap intermediate between the energy bandgaps of the quantum-wells and the oxidation aperture and lower mirror stack.

The confinement layers may have an energy bandgap equal to that of the barrier layers or intermediate between the energy bandgap of the barrier layers and the oxidation aperture and lower mirror stack.

The quantum-wells provide quantum confinement of electrons and holes therein to enhance recombination for the generation of light. The number and location of quantum-wells may further provide means for increasing the optical gain. In the described exemplary embodiment, the quantum-well layers 110 may be positioned near an antinode or peak (i.e. maximum) 152 of the electric field of the light in the optical cavity to increase the efficiency for light generation therein (see FIG. 3). In the described exemplary embodiment the confinement layers may have a semiconductor alloy composition that is uniform in the growth direction, forming a separate confinement heterostructure (SCH) active region 108.

In an exemplary VCSEL structure, the oxide aperture may be formed above the optical cavity by the steam oxidation of an Al-containing semiconductor layer. The oxidized outer portion of the oxide aperture has increased resistivity providing lateral current constriction to reduce the volume of the gain region. In the described exemplary embodiment the current constriction formed by the oxidized portion of the oxide aperture reduces the diameter of the current aperture below the diameter formed by the VCSEL p-type ohmic contact. In addition, an oxide free central portion of the oxide aperture remains substantially transmissive to light allowing for the injection of current into the active region.

Conventionally, oxide apertures create a large index step that provides a significant waveguiding effect in the transverse dimension. Therefore, conventional oxide confined VCSELs typically have relatively small diameters, generally on the order of about five microns or less, to ensure single-mode operation at wavelengths above 1200 nm. In an exemplary embodiment the thickness of the oxide aperture may be reduced and the aperture may be placed near a node in the standing wave intensity pattern of the optical field to reduce the index step seen by the optical mode. The reduced index step allows for the utilization of a larger diameter oxide aperture while maintaining single-mode operation. The larger diameter oxide aperture further lowers the resistance of the device.

In the described exemplary embodiment, the alloy composition and thickness of the layers forming the oxide aperture are different from the composition and layer thickness of any of the other compound semiconductor layers. As an example, the oxide aperture layers may be formed from AlAs or from AlGaAs with an aluminum composition higher than the aluminum composition of AlGaAs high-bandgap semiconductor layers in the upper mirror stack. In the described exemplary embodiment, the semiconductor layers forming the oxide aperture contain an Al concentration of about 98%. In an exemplary embodiment the oxide aperture 120 may be doped with a dopant type that is the same as the mirror layer immediately adjacent to the oxide aperture. Thus, in the described exemplary embodiment the oxide aperture which is located between the active region and the p-type upper mirror stack may be p-type with a carbon dopant at a concentration of about $1\times10^{17}$ cm$^{-3}$ to $1\times10^{19}$ cm$^{-3}$.

At high currents oxide confined VCSELs tend to develop non-uniform current distribution with "current crowding" at the edges of the high resistivity or oxidized portion of the aperture. Therefore, an exemplary VCSEL structure may further comprise a current spreading layer 122 above the oxide aperture. In the described exemplary embodiment the current spreading layer 122 is highly conductive, comprising a carbon doping spike at a concentration of about $1\times10^{20}$ cm$^{-3}$. The current spreading layer provides a more uniform current distribution across the oxide aperture improving current injection into the optical cavity and further reducing the device resistance. Referring to FIG. 3, in the described exemplary embodiment, the oxide aperture and the heavily doped p-type current spreading layer are positioned at a node 154 in the standing wave intensity pattern of the VCSEL structure to reduce the loss associated with the heavily doped regions and to reduce the effective index step seen by the optical mode.

In an exemplary embodiment of the present invention, the oxidized outer portion of the oxide aperture generally has an annular shape with the oxidation extending inward from one or more etched sidewalls of the mesa. The lateral shape of the annular oxidized portion of the oxide aperture is influenced by the semiconductor alloy composition of the layers surrounding the oxide aperture. The selective oxidation is due to a strong compositional dependence in the lateral oxidation of $Al_xGa_{1-x}As$ layers, for x in the range of about 0.8 to 1.0.

Therefore, the described exemplary embodiment may include a p-type, AlGaAs transition layer 124 having an aluminum composition of approximately 75% to ensure that the oxidized portion of the aperture maintains the desired oxide thickness which is determined by the thickness of the layers forming the oxide aperture 120. The higher the aluminum content in layer 124, the more non-uniform and thicker the lateral shape of the oxide becomes. A low aluminum content poses a high energy barrier to hole flow from the transition layer (124) to the oxide aperture layer 120. Thus, there is a trade-off between control of the oxide shape and electrical resistance.

Figure 4:
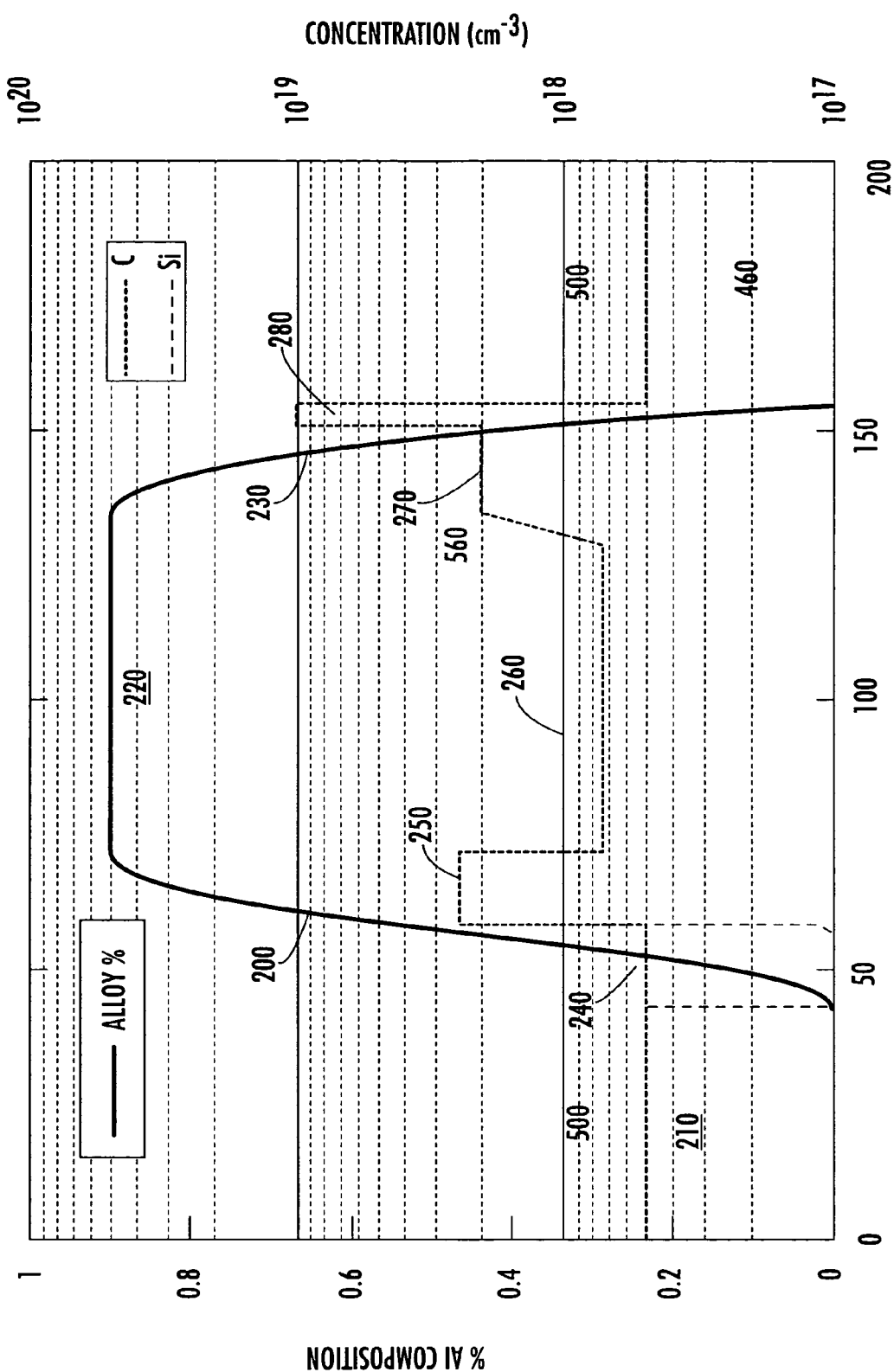
FIG. 4 graphically illustrates the alloy composition and doping levels of one pair of an exemplary p-type upper mirror stack of the VCSEL of FIG. 1 in accordance with an exemplary embodiment of the present invention.

FIG. 2 also illustrates the material composition of the first mirror pair of an exemplary upper mirror, having a high index 130 GaAs layer adjacent to the oxide aperture and current spreading layer. The highly doped p-type region 206 serves a similar purpose as the carbon doping spike shown in FIG. 4. FIG. 4 graphically illustrates the structural details of an exemplary p-type upper mirror from the center of one GaAs layer to the center of the next GaAs layer. In the described exemplary embodiment, the mesa etched into the upper mirror stack reduces the current carrying volume of the upper mirror stack, increasing the resistance thereof with a consequent increase in self heating. VCSEL heating may be further exaggerated in the upper mirror stack due to the current constriction. The oxide aperture further confines the current flowing in the upper mirror stack so that the current density in the constricted region is orders of magnitude higher than it otherwise would be in an un-constricted mirror.

However, the series resistance of a DBR may be decreased by decreasing the valence band discontinuity at the interface between the alternating layers of the mirror stack. Therefore, an exemplary p-type upper mirror stack may utilize techniques, such as compositional grading at the heterojunction interface between alternating layer pairs to reduce the band-discontinuity and the resistance of the p-type upper mirror stack.

For example, an exemplary p-type upper mirror may include compositional grading of the Al concentration and doping across the heterojunction interface between alternating layer pairs. An exemplary p-type upper mirror stack includes biparabolic grading of the Al concentration 200 across the interface of a lower GaAs mirror layer 210 and an AlGaAs layer 220. The biparabolic grading of the Al concentration flattens the valence band by increasing the energy at the bottom of the band and decreasing the energy at the top of the band.

Thus the biparabolic grading may decrease the valence band discontinuity at the hetero-interface between a high index layer and a low index layer. The series resistance is exponentially dependent on the magnitude of the band-discontinuity of the valence band at the heterojunction and may also be significantly reduced.

In addition, the described exemplary p-type upper mirror stack may include a parabolic grading 230 of the Al concentration across the downward interface between an AlGaAs mirror layer and a GaAs layer. The parabolic grading improves the lateral conductivity of the mirror stack reducing the overall resistivity of the device.

In an exemplary embodiment of the present invention the GaAs mirror layers 210 are p-type with a carbon dopant at a concentration in the range of about $2\times10^{17}$–$2\times10^{18}$ cm$^{-3}$. However, as shown in FIG. 4 an exemplary p-type upper mirror stack may include an n-type doping spike 240 and a p-type doping spike 250 at the layer edges of the biparabolic upward interface 200 between alternating GaAs and AlGaAs layers. The n-type 240 and p-type 250 doping spikes flatten the valence band, and further reduce the bandgap discontinuity across the layer interface and therefore further improve the vertical conductivity of the mirror stack.

In an exemplary embodiment of the present invention the n-type doping spike 240 may comprise a silicon dopant at a concentration in the range of about $2\times10^7$–$2\times10^{18}$ cm$^{-3}$ with a preferred concentration of about $5\times10^{17}$ cm$^{-3}$. In an exemplary embodiment the p-type doping spike 250 at the biparabolic interface may comprise a carbon dopant at a concentration in the range of about $1\times10^{18}$–$3\times10^{18}$ cm$^{-3}$ with a preferred concentration of about $2.5\times10^{18}$ cm$^{-3}$.

In the described exemplary embodiment the alternating AlGaAs mirror layers 220 include a region 260 that is p-type, with a carbon dopant at a concentration in the range of $6\times10^{17}$–$1\times10^{18}$ cm$^{-3}$ with a preferred concentration of about $8\times10^{17}$ cm$^{-3}$. The parabolic interface region may include a region 270 wherein the concentration of the carbon doping is increased to a concentration of about $2\times10^{18}$ cm$^{-3}$ to transition between the low doped region 260 and a carbon doping spike 280 on the downward parabolic grade of the Al concentration. The doping spike 280 may be formed from a carbon dopant at a concentration in the range of $5\times10^{18}$–$2\times10^{19}$ cm$^{-3}$ with a preferred concentration of about $1\times10^{19}$ cm$^{-3}$.

Referring briefly to FIG. 3, in the described exemplary embodiment the carbon doping spike may be located at a null in the optical standing wave pattern of the VCSEL structure thereby increasing the number of holes at a point of reduced field strength to reduce free carrier absorption. The increased doping level in region 270 flattens the valence band by compensating the hole depletion from the high aluminum composition of the parabolic grade, reducing the bandgap discontinuity across the interface between the low doped 260 and high doped regions 280, thereby improving the vertical conductivity of the device.

Referring back to FIG. 1, in an exemplary embodiment of the present invention, the mesa may be formed by etching down to the n-type contact stack 16 by a wet or a dry etching process such as reactive ion etching (RIE) reactive ion beam etching (RIBE), or the like. The mesa may be formed by lithographically patterning the top surface of the upper mirror 20 and depositing thereon a suitable material (for example, silicon nitride, silicon oxide, silicon oxynitride, metal silicides, or refractory metals) as an etch mask. After etching the mesa structure down to the n-type contact stack 16, the etch mask may be left in place to protect the top layer of the upper mirror, or removed prior to the oxidation process. In forming the mesa, the etch depth may be measured by reflectometry to precisely control the etch depth, and to allow the etch process to be stopped after etching down at least to the upper surface of the n-type contact stack.

The oxidation process may be carried out by placing the wafer into a container and heating the wafer to a temperature of about 350 to 500° C. under a controlled environment having a high humidity. Such a moist environment may be generated, for example, by flowing a gas, such as nitrogen, through water heated to about 80–95° C. to entrain water vapor, and then directing the moisture-laden gas into the container.

The time required for formation of the annular oxidized portion of the oxide aperture depends upon a number of variables. For example, the oxidation rate of materials such as AlGaAs is sensitive to the Al concentration in the alloy as described by Choquette et al. in Electronics Letters 30, pp. 2043–2044 (1994). The time required to complete the oxidation may also depend on the temperature to which the semiconductor wafer is heated, the thickness of the oxide aperture layers and the lateral extent to which the oxide aperture layers are to be oxidized (i.e. the lateral dimension of the annular oxidized portion). After the oxidation process is completed, an insulation layer (not shown) may be deposited onto the semiconductor wafer to protect and passivate the etched mesa and exposed semiconductor layers, and to planarize the light-emitting device 10 formed on the semiconductor wafer.

In an exemplary embodiment of the present invention interconnect metalizations may be formed to electrically couple the p-type and n-type ohmic contacts to wire bond pads. Conventional interconnect metalizations for oxide confined VCSELS are typically large area deposits formed above a relatively high conductivity semiconductor substrate material. Conventional interconnect metalizations may therefore create an effective parasitic capacitance between the contacts and the high conductivity semiconductor substrate material, creating a parasitic current flow through the device at high data rates. The parasitic effects created by the interconnect metalizations may limit the maximum data rate of the light emitting device.

Therefore in the described exemplary embodiment, a second etch may be performed to remove a portion of the n-type contact stack, external of the n-type ohmic contact, and at least a portion of the undoped lower mirror. In this embodiment, the interconnect metalizations may then be formed on a highly resistive undoped mirror/substrate stack. The highly resistive semi-insulating substrate and un-doped lower mirror stack substantially reduce the parasitic capacitance typically associated with the metal leads and bond pads of a VCSEL and increase the maximum operating data rate.

However, the deep etch mesa formed to expose the oxide aperture to an oxidizing agent and to provide a high resistivity contact area complicates the approach to coupling an interconnect metal to the p-type ohmic formed on the p-type upper mirror stack for current transport through the top DBR. The described exemplary VCSEL may utilize a layer of polyimide to form a ramp from the top of the mesa to the high resistivity planar area adjacent to the mesa. The interconnect metalization may then be formed on the polyimide ramp to couple the bond pad to the top of the mesa.

Figure 5:
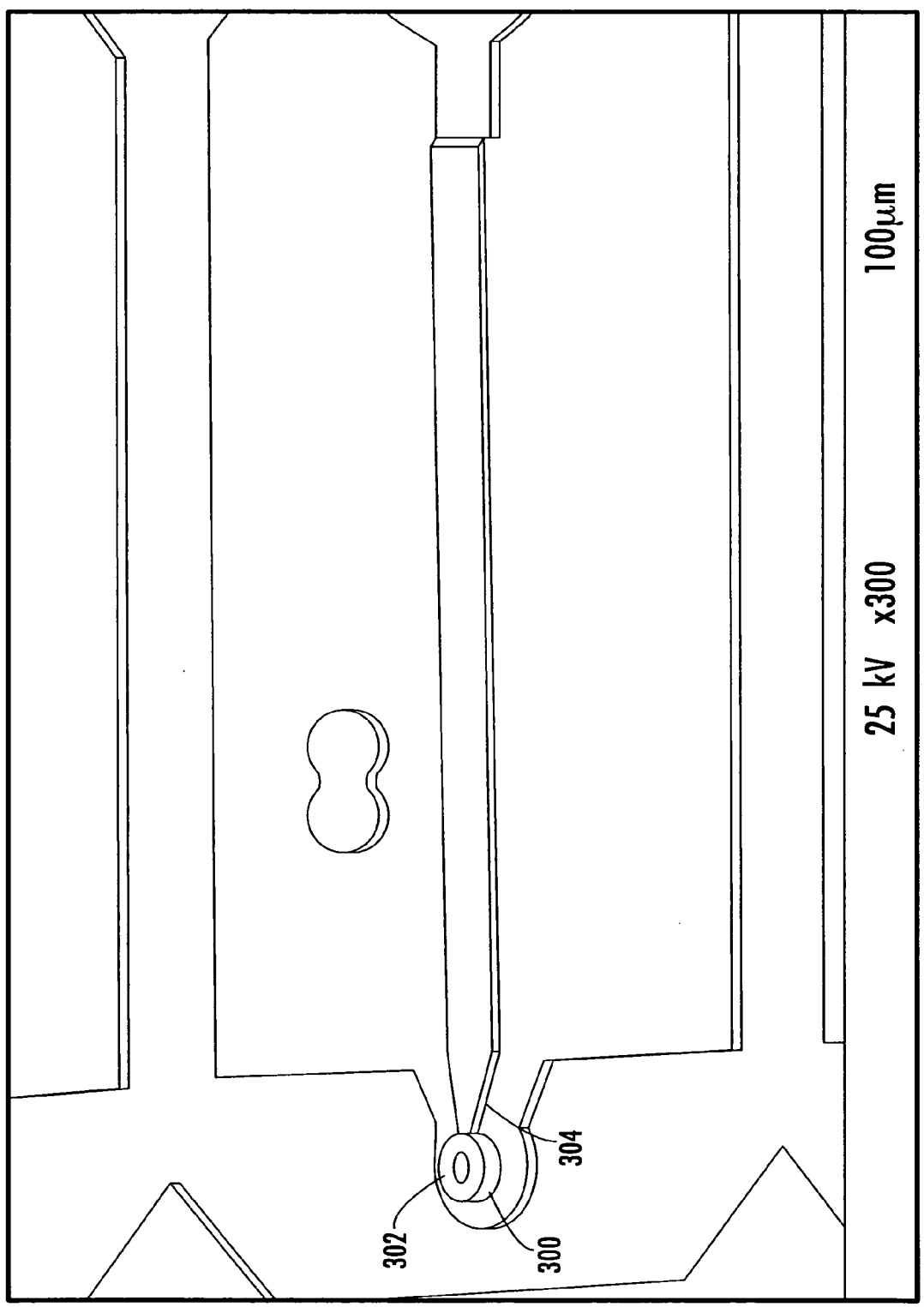
FIG. 5 is a scanning electron micrograph of the VCSEL of FIG. 1 in accordance with an exemplary embodiment of the present invention.

For example, FIG. 5 is a scanning electron micrograph of an exemplary longwave VCSEL wherein a p-type ohmic contact 302 is formed on an upper surface of a mesa 300. In this embodiment a polyimide layer 304 forms a grade from the top of the mesa to a high resistivity area 310 adjacent to the mesa 300. An interconnect metalization 306 may then be deposited to couple the p-type contact 302 on the upper surface of the mesa to a bond pad 308 formed on the high resistivity layer adjacent the mesa.

Figure 6:
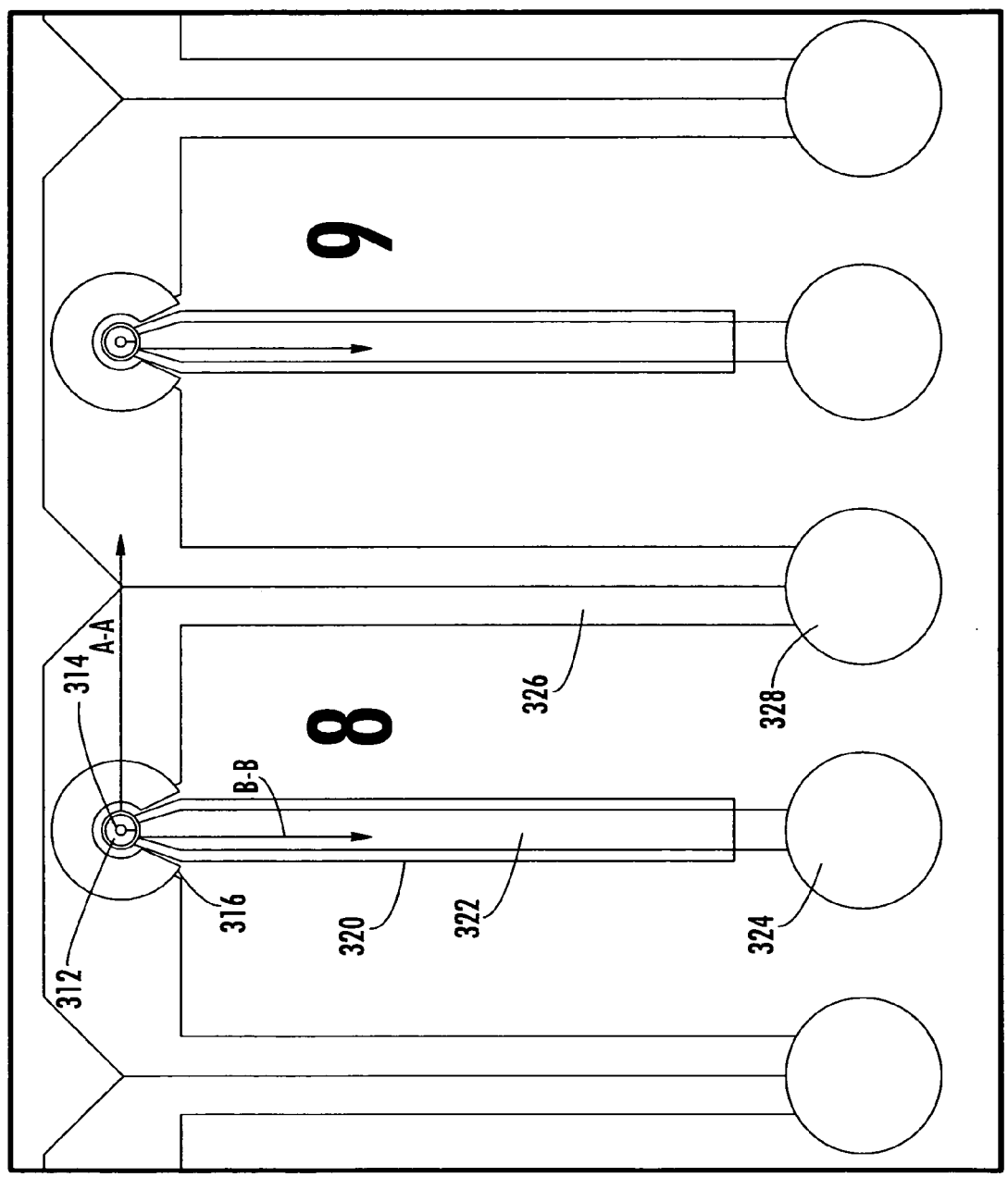
FIG. 6 is a mask diagram for forming the VCSEL of FIG. 1 in accordance with an exemplary embodiment of the present invention.

Further, FIG. 6 is an exemplary mask for forming a long wavelength light emitting device. In the described exemplary embodiment a p-type ohmic contact mask 312 is formed on an upper surface of a mesa structure that is defined by mesa mask 314. The described exemplary mask layout may further include a mask layer 320 for depositing a polyimide layer that provides a grade from the top of the mesa to a high resistivity area adjacent to the mesa.

A p-type interconnect metalization mask layer 322 overlaps the polyimide mask and couples the p-type ohmic contact to a bond pad formed by mask 324.

In the described exemplary embodiment the n-type intra-cavity contact may be formed by mask 316. The annular n-type intra-cavity contact does not completely encircle the mesa structure. Rather, the n-type intra-cavity contact terminates outside the polyimide ramp layer and p-type interconnect metalization. In an exemplary embodiment, an interconnect metalization 326 couples the n-type intra-cavity contact to a bond pad formed by mask 328 also located on a high resistivity semiconductor layer.

Referring now to FIGS. 7A–7J there is shown a series of cross-sections (including both sections AA taken through the n-type intra-cavity contact and BB taken through the polyimide/interconnect metalization of FIG. 6) that illustrate an exemplary processing method to produce VCSELs in accordance with the present invention. There are many means and methods to fabricate optoelectronic devices and the method illustrated in FIG. 7 is only one example. Individual steps of the example method may be incorporated into alternative fabrication methods. It is emphasized that, according to common practice, the various features of the drawings are not to-scale. On the contrary, the dimensions of the various features are arbitrarily expanded or reduced for clarity.

Figure 7A:
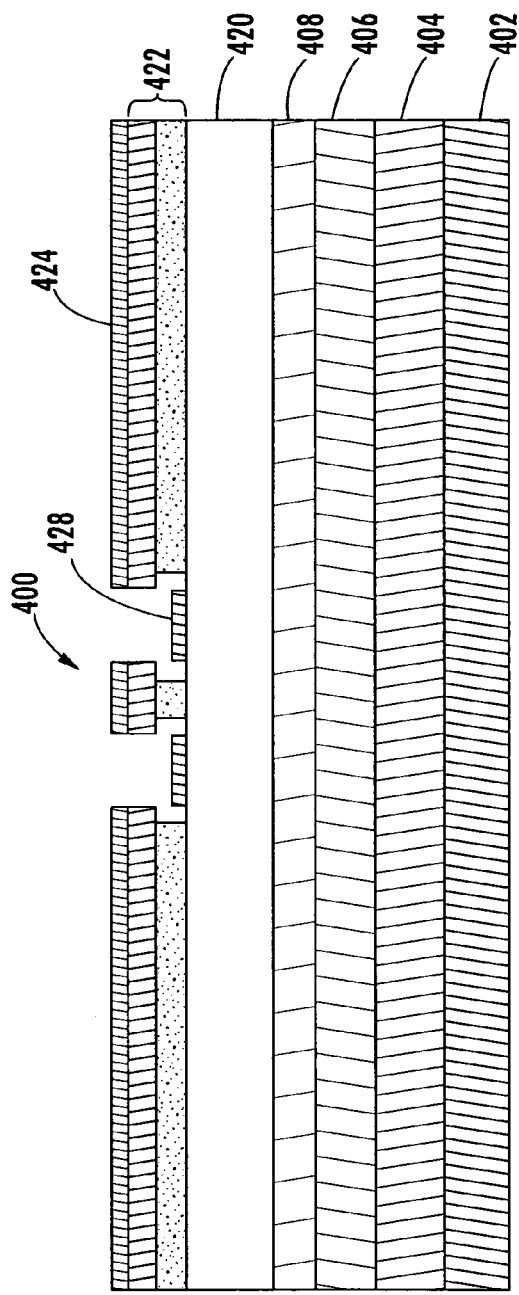
Figure 7B:
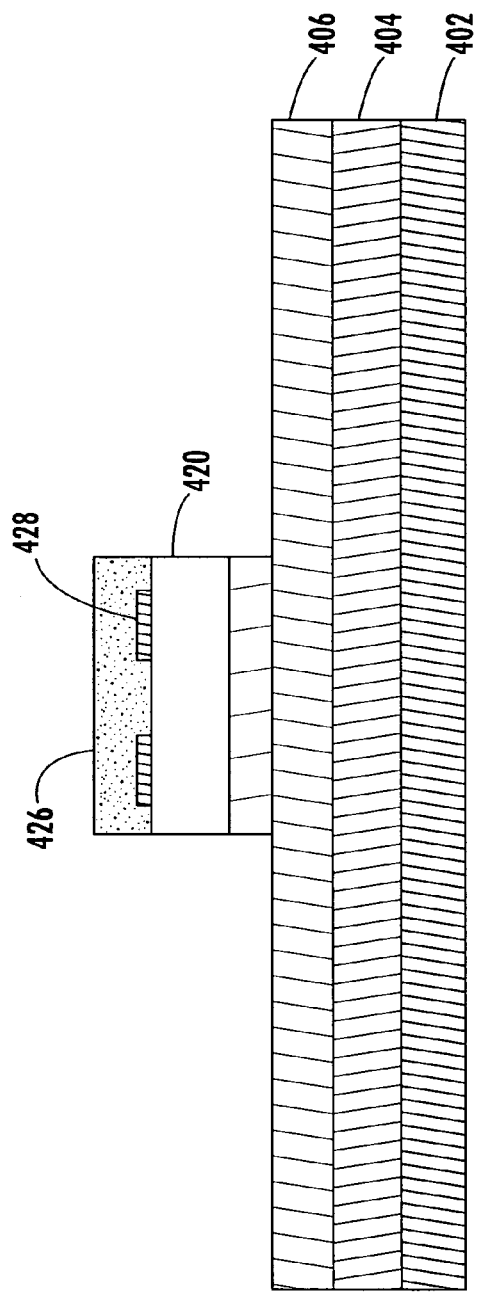

Referring to the cross section of FIG. 7A in an exemplary embodiment of the present invention, the semiconductor light-emitting device 400 comprises a plurality of compound semiconductor layers epitaxially-grown on a semi-insulating substrate 402. In the described exemplary embodiment, the semiconductor layers form a lower mirror stack 404 above the substrate and an n-type contact stack 406 above the lower mirror stack 404 and below an optical cavity 408. Further an upper mirror stack 420 may be formed above the optical cavity. In the described exemplary embodiment an oxide aperture (not shown) may be formed near the top of the optical cavity and near the upper mirror stack. The oxide aperture may comprise, for example, low index layers of AlGaAs that are selectively oxidized in part to provide electrical and optical confinement.

In accordance with an exemplary process for producing VCSELs a p-type ohmic contact may be formed from a lithographic masking and lift-off process. In the described exemplary embodiment a multi-layer photoresist 422 may be deposited across the upper surface of the light emitting device patterned and etched prior to the deposition of the p-type metalization 424 which forms p-type contact 428. Referring to the cross-section of FIG. 7B, an etching process such as reactive ion etching (RIE), reactive ion beam etching (RIBE), or the like may be used to selectively remove the semiconductor layers formed above the n-type contact stack 406. The mesa may be formed by lithographically patterning the top surface of the upper mirror 420 and depositing thereon a suitable material (for example, silicon nitride, silicon oxide, silicon oxynitride, metal silicides, or refractory metals) as an etch mask 426.

Figure 7C:
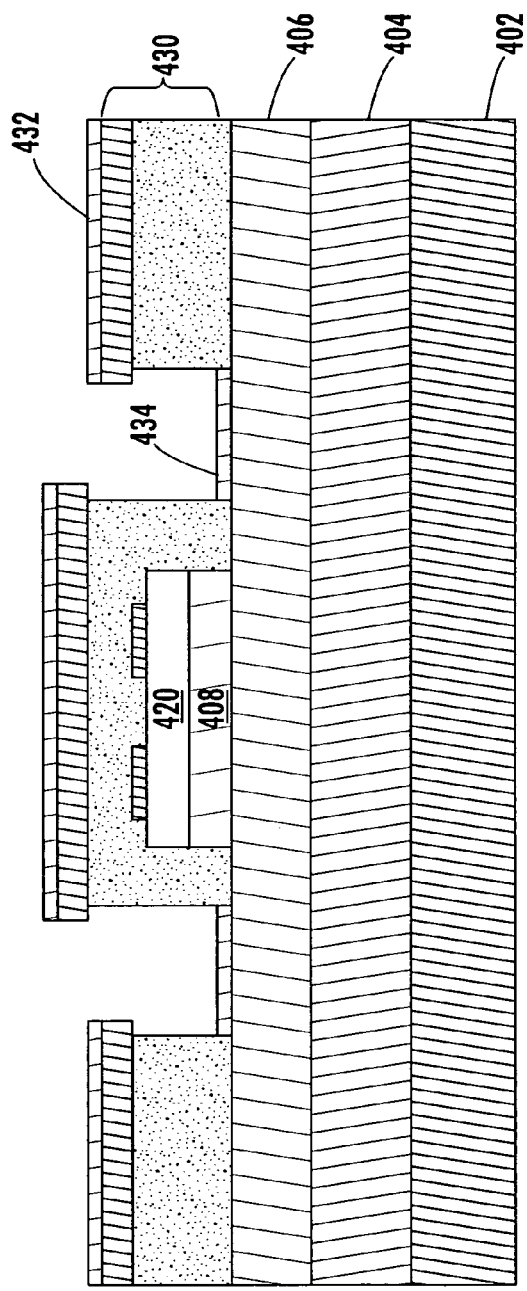
Figure 7D:
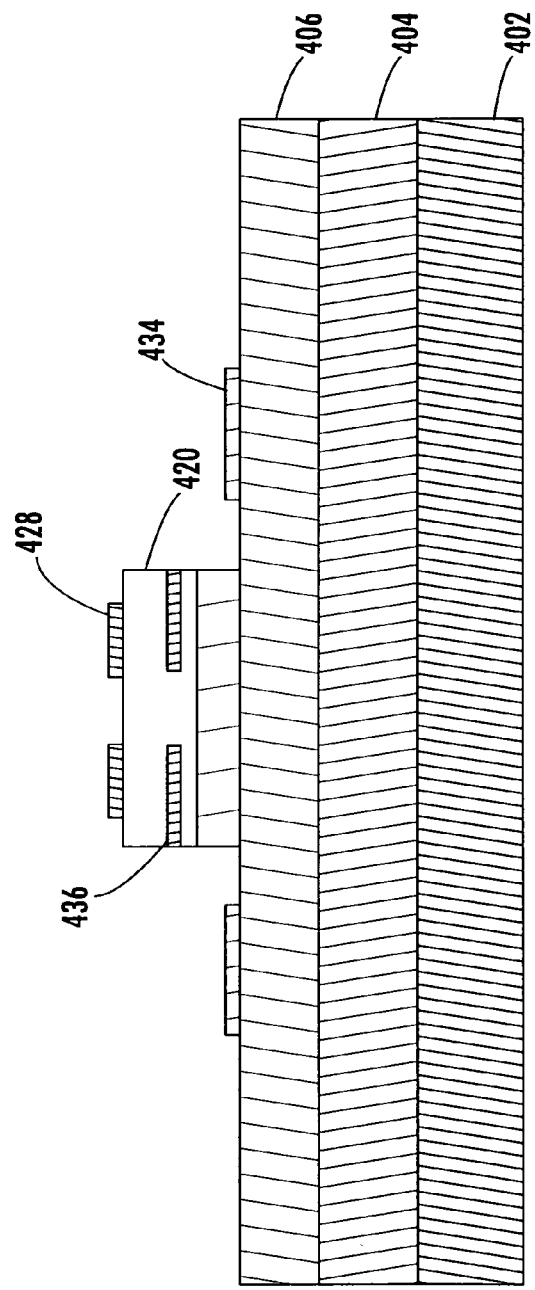

Referring to FIG. 7C, the n-type intra-cavity contact (also referred to as an n-type ohmic contact) may also be formed from a lithographic masking and lift-off process wherein a multi-layer photoresist 430 may be deposited across the upper surface of the light emitting device patterned and etched prior to the deposition of the n-type metalization 432 which forms n-type intra-cavity contact 434. Referring to FIG. 7D, the annular oxide aperture 436 may then be formed by placing the wafer into a container and heating the wafer to a temperature of about 350 to 500 degree C. under a controlled environment having a high humidity.

Referring to FIG. 7E, a patterned mask 450 may be deposited and a second etch performed to remove a portion of the n-type contact stack 406 outside the n-type intra-cavity contact 434 and a portion of the lower mirror structure. The second etch provides an isolation region 452 for depositing an interconnect metal on the high resistivity unloaded mirror structure.

Referring to FIG. 7F, a passivation layer 454 may be deposited onto the semiconductor wafer to protect and passivate the etched mesas and exposed semiconductor layers. The passivation layer may be formed any one of variety of insulating material commonly used in the art including polyimides, spin-on-glasses, silicon dioxide, silicon nitride, and the like.

Figure 7G:
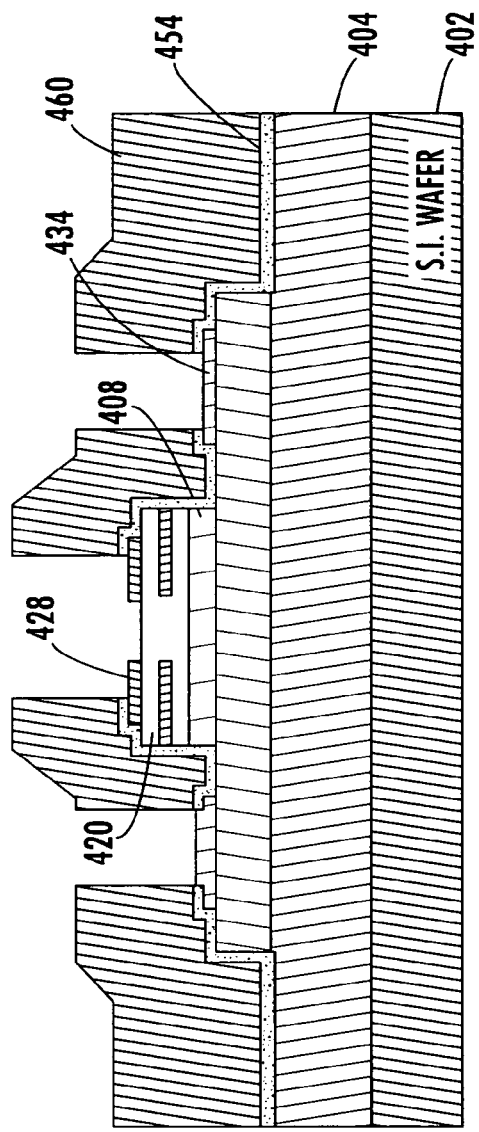
Figure 7H:
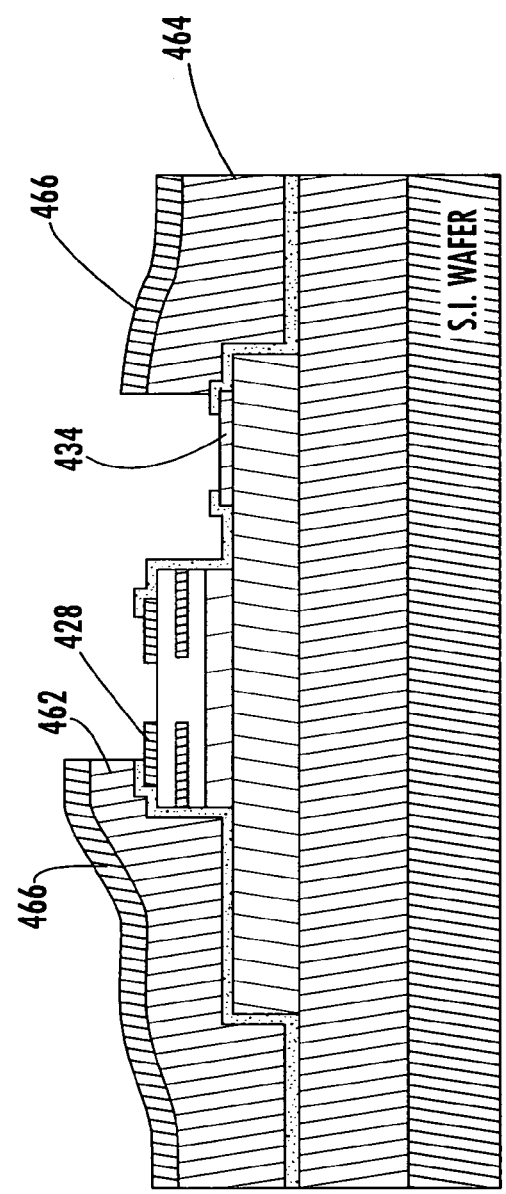

Referring to FIG. 7G, vias may be etched, masked by photoresist 460, in the passivation layer 454 to provide access to the p-type 428 and n-type 434 ohmic contacts. FIG. 7H illustrates cross-section BB (see FIG. 6) taken through polyimide layers 462 and 464 that are deposited and etched in accordance with photoresist 466 to form ramps from the isolation region 452 (FIG. 7E) to the p-type and n-type contacts respectively. Referring to FIG. 7I, photoresist mask 466 may then be removed and interconnect metalizations 500 and 502 may then be formed from bonding pads 510 on the isolation region 452 to the p-type and n-type ohmic contacts respectively as shown in FIG. 7J. The described exemplary contacting technique minimizes parasitic capacitance between the contacts and bond pads and lengthens the metal leads between the VCSEL and the bond pad to allow for the closest possible proximity of the optical fiber to the VCSEL without interference from bond wires.

Figure 8:
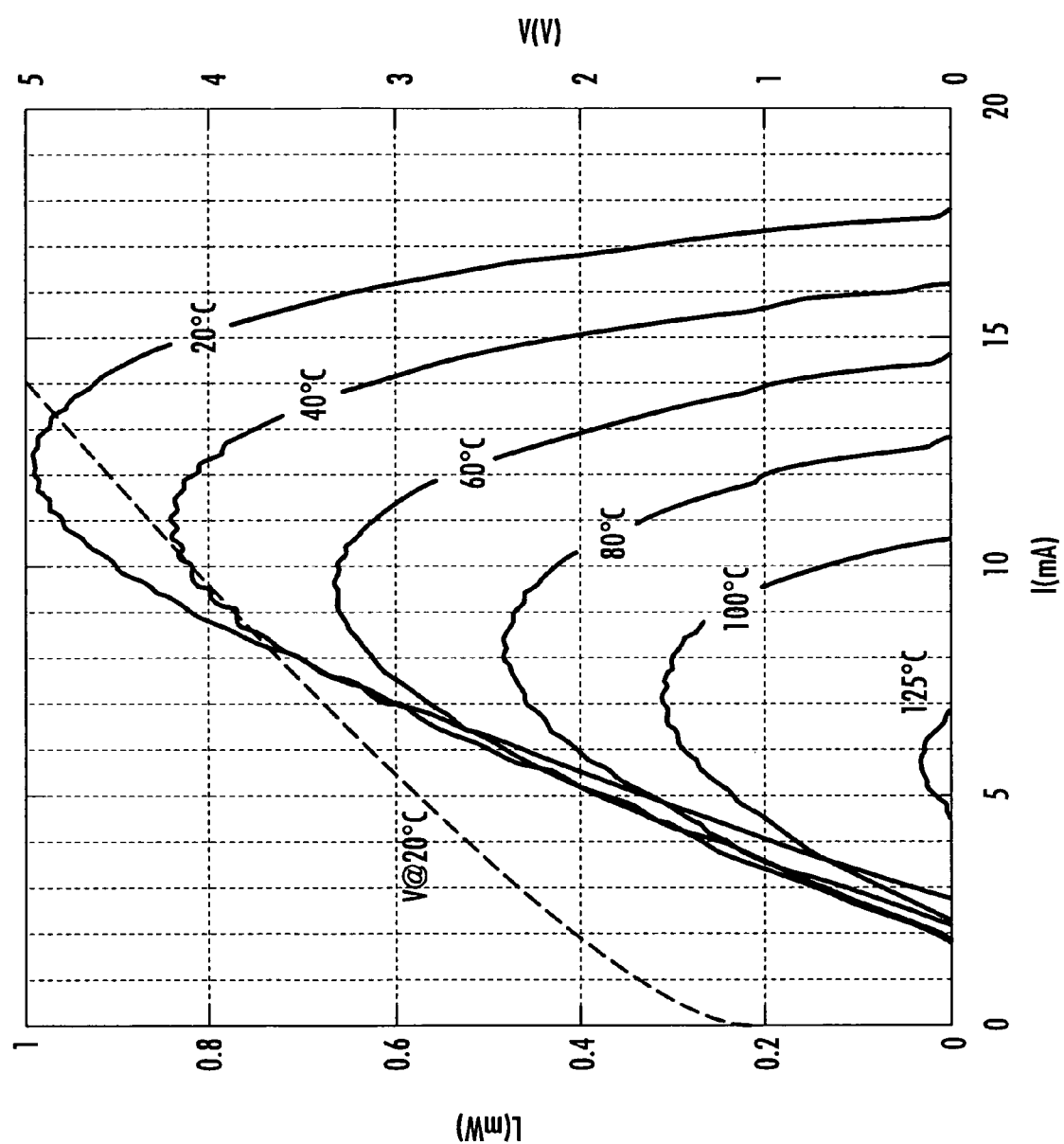
FIG. 8 is a light intensity diagram graphically illustrating the performance of the VCSEL of FIG. 1 over temperature in accordance with an exemplary embodiment of the present invention.
Figure 9:
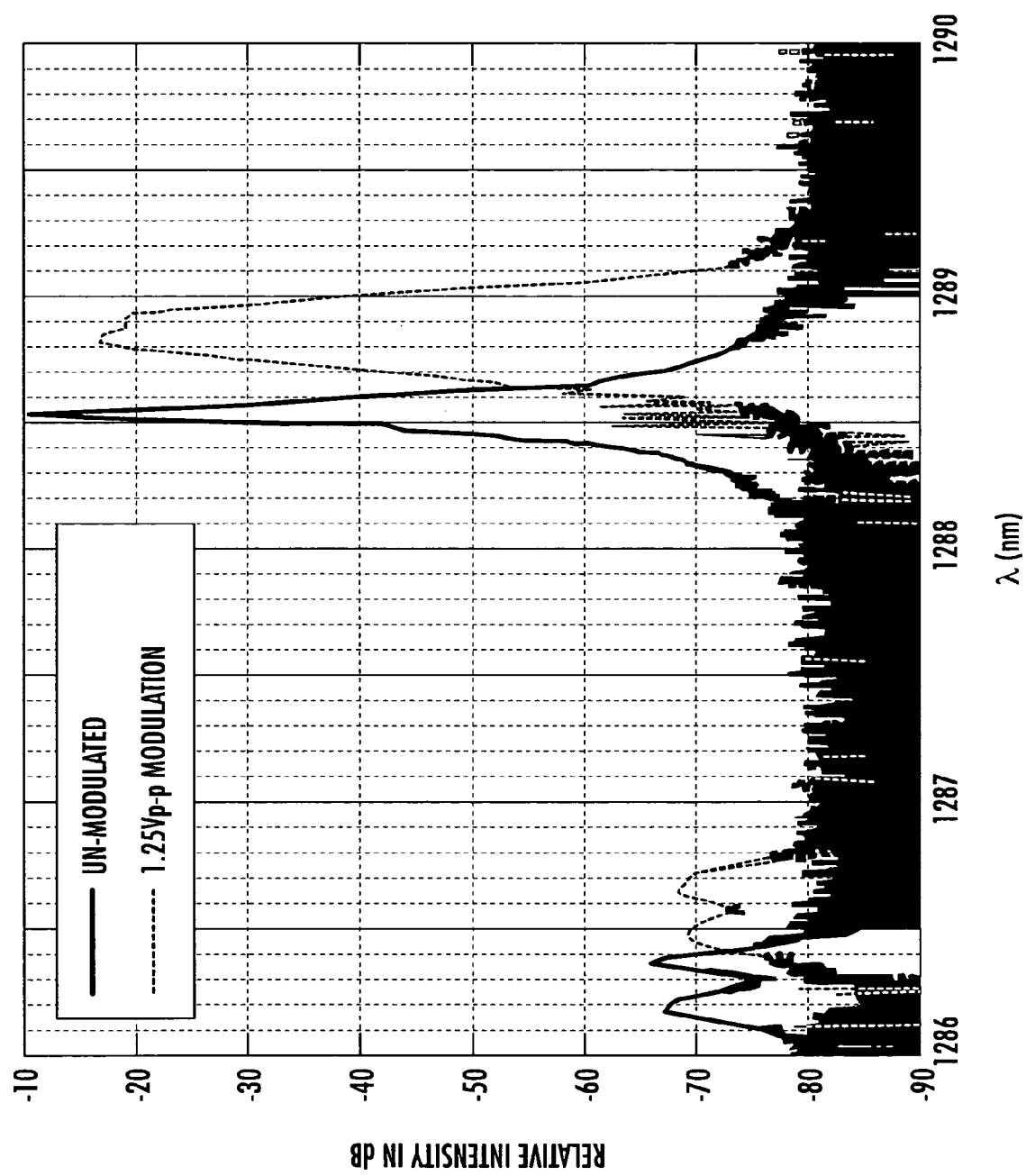
FIG. 9 graphically illustrates the lasing spectra of the VCSEL of FIG. 1 at 1289 nm with over 30 dB side mode suppression for both a 10 Gb/sec modulation using a pseudo-random bit sequence and unmodulated in accordance with an exemplary embodiment of the present invention.

FIG. 8 graphically illustrates the DC light intensity versus current characteristics of an exemplary VCSEL light emitting device with a 5 μm diameter oxide aperture over a wide temperature range, with lasing observed up to a stage temperature of 125 degree C. The measured lasing spectrum at room temperature (solid curve trace in FIG. 9) shows a fundamental lasing peak at 1288.5 nm, a 20 dB width of 0.07 nm, and a side-mode suppression ratio of better than 30 dB. Furthermore, devices of this aperture size lase in a single-mode over their entire operating current and temperature range. Devices having an oxide aperture with a 7 μm diameter exhibit peak powers up to 3 mW. However, these devices may demonstrate multi-mode transmission due to the larger diameter effective index guide of the oxide aperture.

The small-signal modulation response of the device was extracted from the S.sub. 21 parameter of a standard two-port network analyzer setup. A maximum relaxation oscillation frequency, $f_R$, of 7 GHz is observed, so given that $1.55 f_R$ is an estimate of the theoretical 3 dB bandwidth, the device is intrinsically capable as a 10 Gbit/s optical source. A 10 Gb/s bit-error rate tester was used to demonstrate that the described exemplary light emitting device performs well as a high-speed source.

Figure 10:
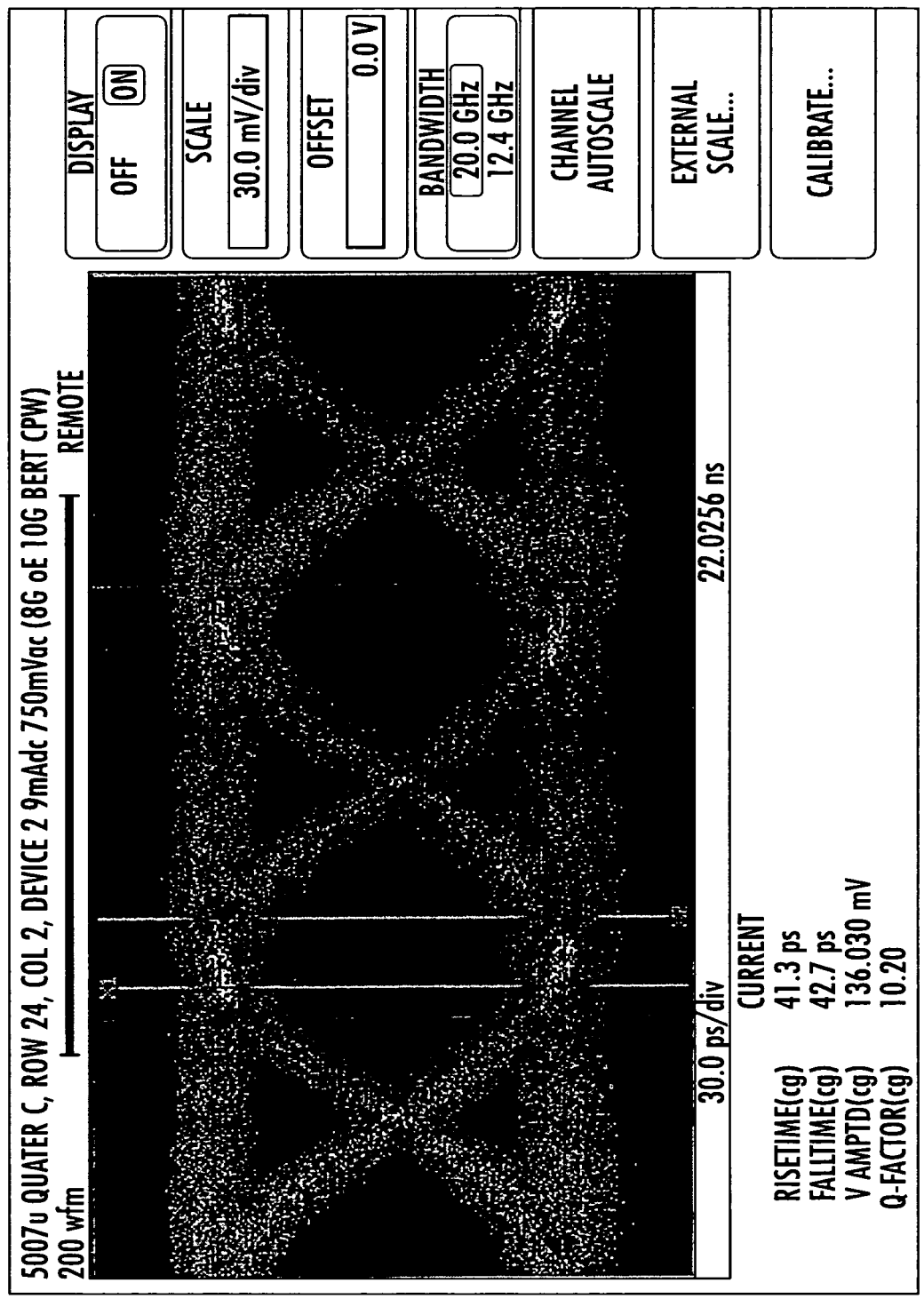
FIG. 10 is a 10 GBit/sec Eye diagram of the VCSEL of FIG. 1 in accordance with an exemplary embodiment of the present invention.

FIG. 10 graphically depicts a 10 Gbit/sec Eye diagram of the described exemplary VCSEL. Eye diagrams illustrate the contrast between transmitted ones and zeros in a pseudorandom input bit stream and are conventionally used to assess the quality of an optical transmitter or link. As is known in the art a light emitting device that is not excessively impaired shows clear discrimination between "ones" and "zeros" with a large "eye opening" in the center of the diagram. The described exemplary VCSEL provides relatively fast rise and falls times, with clear discrimination between "ones" and "zeros" and a wide eye opening, indicating substantially error free transmission at a 10 Gbps data rate.

Aside from the low power consumption, 1.3 μm VCSELs have other inherent advantages over the traditional edge emitter solution. The fully-modulated spectral width (see FIG. 9) has increased to only 0.28 nm. Further the circularly symmetric output of an exemplary VCSEL device provides high coupling efficiency (~65%) using simple butt-coupling with only −135 dB/Hz of RIN which has provided an error-free 10 Gb/s link over 10 km.

One of skill in the art will appreciate that alternate structures may be utilized to form high speed longwave light emitting devices. For example, as is known in the art, extended cavity single mode VCSELs may provide a larger diameter beam with higher output power. An alternative extended cavity embodiment is illustrated in the cross-section of FIG. 11. An exemplary extended cavity may include an ½λ active region comprising multiple InGaAsN quantum wells 600a, 600b, 600c, centered in a one wavelength separate confinement heterostructure (SCH). The described exemplary cavity may further include additional ¼λ cladding layers 602, 604 on each side of the active area.

In the described exemplary embodiment, additional extension layers may be added between the active region and at least one of the mirrors to expand the effective optical cavity length of the device. In one embodiment, an extension layer 608 may be added between the n-type contact stack 16 and the un-doped lower mirror 14 using a high thermal conductivity material, such as AlAs. This embodiment provides the added benefit of reducing the VCSELs overall thermal impedance, thereby improving the temperature performance of the device. In addition, the extension layer 608 may be un-doped so as not to increase the optical loss of the device.

The optimum extended cavity length for an oxide confined VCSEL is in the range of about five to seven wavelengths so that the extension layer may have an optical thickness in the range of about 4–6 times the wavelength of light emitted in the optical cavity. One of skill in the art will appreciate that the described exemplary extended cavity VCSEL may be implemented in a variety of manners. For example, an extension layer may also be formed above the active region or upper and lower extension layers may be formed above and below the active region. The optical thickness of the upper and lower extensions layer may be equal or unequal forming asymmetric extensions about the active region. One of skill in the art will further appreciate that the cavity extension layer may also be formed from other optically passive materials such as, for example, silicon dioxide, another semiconductor material, such as aluminum gallium arsenide, air, or a hybrid of any of the above.

In operation the extension layer 608 extends the optical thickness of the cavity and increases the diameter of the emitted light beam. The increase in the diameter of the emitted light beam provides a beam of greater power, with lower divergence angles and reduced aperture-related diffraction. An undesirable effect of extending the cavity is that the device speed as represented by the relaxation oscillation frequency (ROF) may be reduced as the cavity is extended. However, the described exemplary embodiment has relatively low parasitic capacitance so that the cavity may be extended and the device remains capable of operation at sufficiently high speeds for typical long wavelength data communications.

Figures 12A, 12B, 12C, 12D:
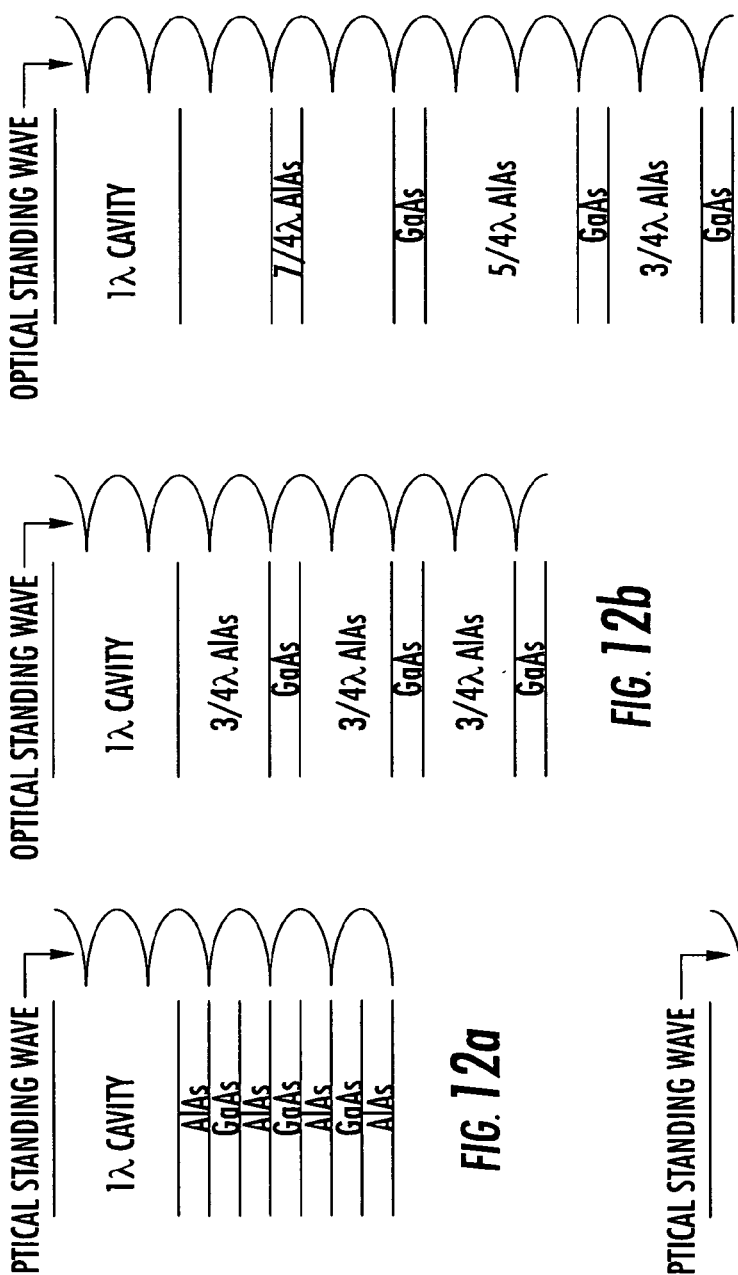
FIGS. 12a–12d graphically illustrate asymmetric mirror designs for extending the cavity in accordance with an exemplary embodiment of the present invention.

The effective optical cavity length also increases with increasing penetration depth into the mirror structure. Conventionally, a distributed Bragg reflector (DBR) is formed from alternating ¼λ layers of high and low index material to provide maximum spectral width about the emission wavelength as illustrated in FIG. 12a. In an alternate embodiment of the present invention, the bottom mirror may be extended to increase the mirror penetration depth. Advantageously the extended mirror design restricts the number of longitudinal modes that are supported by the cavity while simultaneously providing large diffraction losses for higher order modes. In addition, the extension of the un-doped lower mirror layers does not increase the optical loss of the device.

In one embodiment, an exemplary extended mirror comprises asymmetric mirror periods having ½ λ extensions uniformly added to each of the AlAs layers as illustrated in FIG. 12b. Alternatively, an exemplary extended mirror may have a greater number of ½ λ AlAs mirror extensions closer to the active region with shorter and fewer extension layers further from the active region as illustrated in FIG. 12c. In this embodiment an integral number of ½λ extensions are added to the various AlAs mirror layers in the undoped lower mirror stack. Advantageously the high thermal conductivity AlAs extension layers provide the added benefit of reducing the VCSEL's overall thermal impedance, thus improving the temperature performance of the device.

Another extended mirror may utilize a lower reflectivity design to extend the penetration depth of the optical field into the upper or lower mirrors. In one embodiment, lower contrast semiconductor alloys, such as, for example, 50% AlGaAs and AlAs may be utilized as the alternating layers in the lower DBR mirror stack. Another extended mirror design may utilize a half-wave period with asymmetric optical layer thicknesses, such as a layer of 25% AlGaAs having an optical thickness equal to about 0.15 λ and an AlAs layer having an optical thickness equal to about 0.35 λ, as illustrated in FIG. 12d. Extended effective cavity concepts are described more fully in U.S. patent application Ser. No. 10/072,067, filed Feb. 5, 2002, entitled "EXTENDED EFFECTIVE CAVITY SINGLE MODE VCSELS", which is hereby incorporated by reference for all purposes as if set forth in its entirety.

Those skilled in the art will understand that various modifications may be made to the described embodiment. For example, the present invention is not limited to a particular mirror extension design. Rather various modifications may be made to the upper and lower mirror stacks to increase the output power and reduce the electrical resistance and thermal impedance of the device.

In addition, high speed, single mode, long wavelength structures may also be formed on conducting substrates. In this and other embodiments, common reference numerals may be used to represent like components. For example referring to FIG. 13, in another embodiment, a semiconductor light-emitting device 710 may comprise a plurality of compound semiconductor layers epitaxially grown on a semiconductor substrate 712. The semiconductor layers may form a lower mirror stack 714 above the substrate, an upper mirror stack 20 above the lower mirror stack and an active region 18 sandwiched between the mirror stacks. The described exemplary embodiment may further include an oxidation aperture 22 located near the top of the optical cavity and adjacent the upper mirror stack 20.

Figure 13:
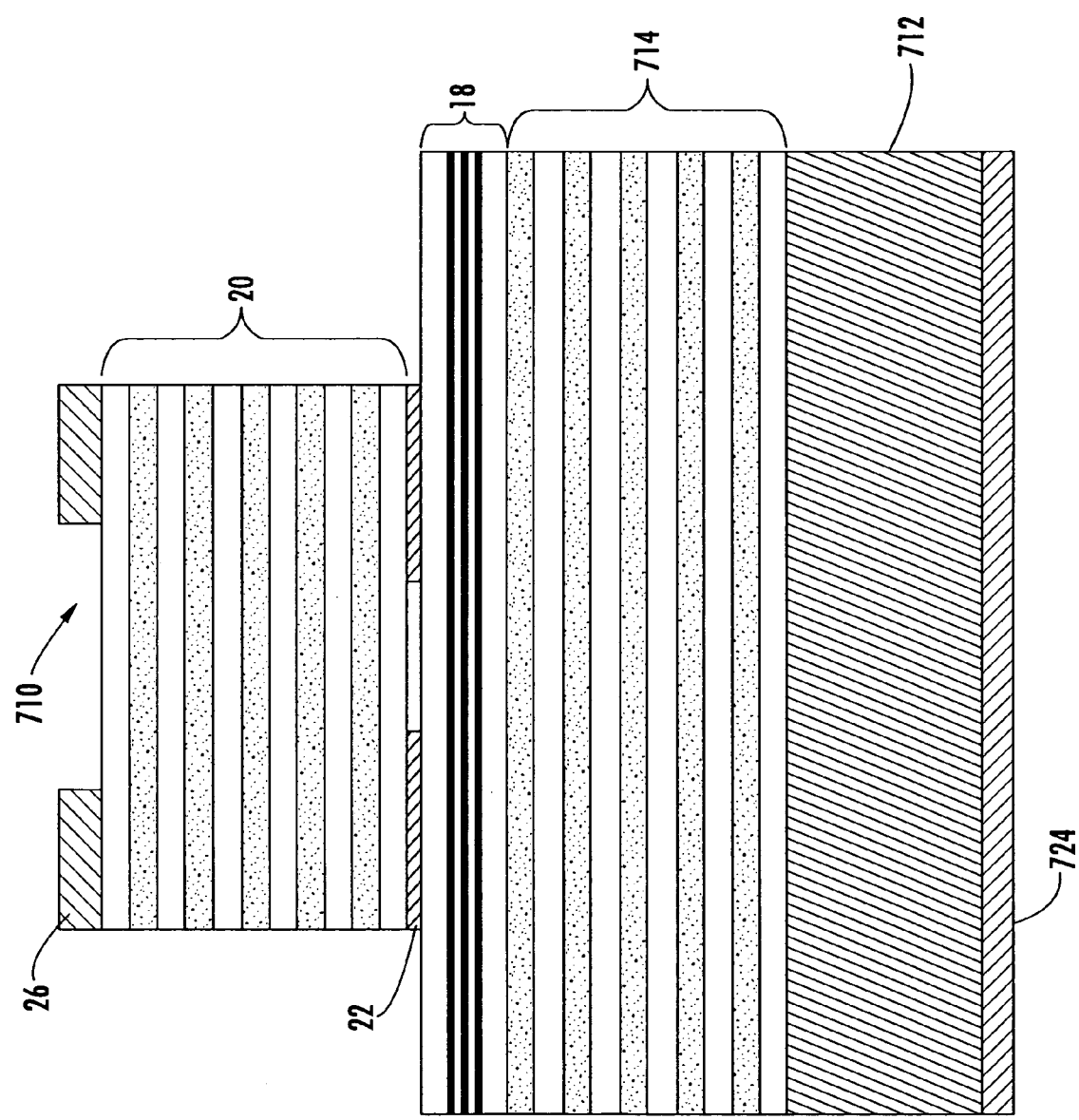
FIG. 13 is a cross-sectional view of an alternate long wavelength VCSEL structure in accordance with an exemplary embodiment of the present invention.

In this embodiment the semiconductor layers may be etched downward at least to the oxidation aperture 22 as shown in FIG. 13, thereby forming a mesa. A p-type ohmic contact 26 may be deposited above the upper mirror stack 20 and an n-type ohmic contact 724 may be formed below the substrate 712. The n-type ohmic contact 724 comprises an n-type metalization such as AuGe/Ni/Au provided either full-surface metalization on the lower surface of the substrate 712, or patterned to provide an annular aperture therethrough centered about the oxidation aperture 22. An optional insulation layer (not shown) may be provided to protect the etched mesa, and to provide support for connections to the p-type ohmic contact 26.

In an exemplary embodiment, the lower and upper mirror stacks may be formed from alternating quarter-wavelength-thick layers of $Al_{0.90}Ga_{0.10}As$ and GaAs for operation at a wavelength near 1.3 μm. In the described exemplary embodiment, the lower mirror may comprise on the order of about thirty six mirror periods and the upper mirror stack may comprise on the order of about twenty three mirror periods. One of skill in the art will appreciate that the Al content in the AlGaAs upper and lower mirror stacks may vary, preferably in the range of about 0.8–0.96. The upper mirror stack 20 is a highly reflective, low resistance mirror as previously described with respect to FIG. 4.

In the described exemplary embodiment the semiconductor substrate 712 is GaAs, that may be doped, for example, n-type with a suitable n-type dopant such as Si. A semiconductor buffer layer (not shown) such as a thin layer of GaAs doped with Si may initially be epitaxially grown on the substrate 712 prior to the growth of the lower mirror stack 714. In the described exemplary embodiment the GaAs substrate 712 is transmissive for wavelengths above 900 nm. Therefore, in some cases, light may be emitted from the lower side of the VCSEL 710 through an annular aperture formed in the n-type ohmic contact 724 to enable backside monitoring of the laser output intensity for control thereof to maintain a consistent laser output over time.

Figure 14:
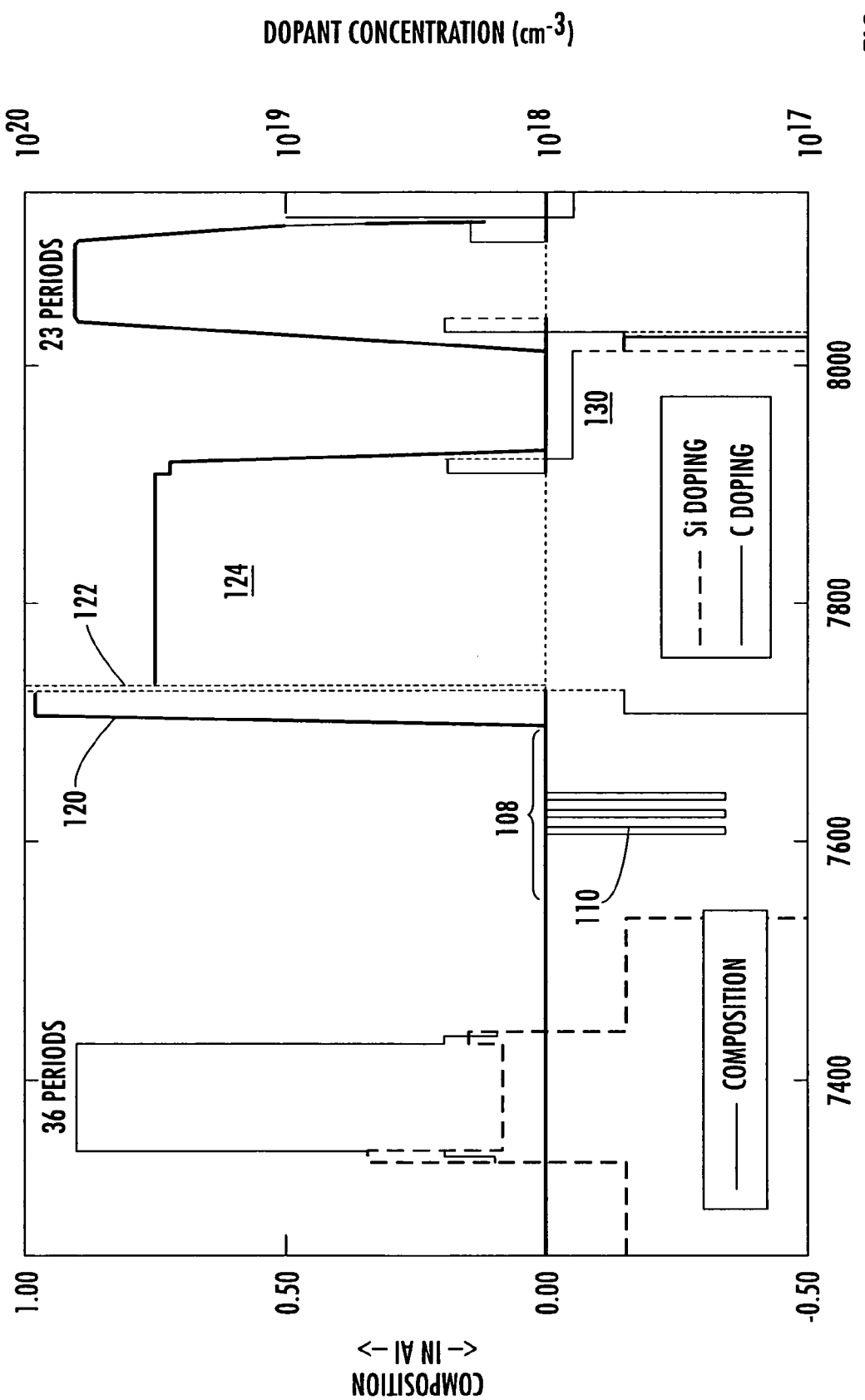
FIG. 14 graphically illustrates the alloy compositions and doping levels of the VCSEL of FIG. 13 including a lower mirror period adjacent the active region, through one period of the upper mirror stack in accordance with an exemplary embodiment of the present invention.

FIG. 14 graphically illustrates the alloy compositions and doping levels of the exemplary VCSEL illustrated in FIG. 13. The alloy composition and doping levels are shown for one period of the lower mirror stack adjacent to the optical cavity, through the first period of the upper mirror stack adjacent to the optical cavity. As previously described with respect to the VCSEL structure of FIG. 2, the alternate VCSEL comprises an optical cavity having an active region 108 comprising one or more undoped InGaAsN quantum wells 10 separated by GaAs barrier layers. Fractionally, the In may range from about 0.3–0.4, and the Nitrogen may range from greater than 0.01 to less than about 0.02.

In an exemplary alternate embodiment, there are three $In_{0.34}Ga_{0.66}As_{0.988}N_{0.012}$ quantum wells, with barrier layers surrounding and separating the quantum wells. The barrier layers preferably have an energy bandgap intermediate between the energy bandgaps of the quantum-wells and the oxidation aperture and lower mirror stack. The quantum-wells provide quantum confinement of electrons and holes therein to enhance recombination for the generation of the light.

In the described exemplary alternate VCSEL structure having a conducting substrate, an oxide aperture is again formed above the active region as previously described with respect to the VCSEL of FIGS. 1 and 2. The oxide aperture may again be formed from AlAs or from AlGaAs with an aluminum composition higher than the aluminum composition of the AlGaAs high-bandgap semiconductor layers in the upper mirror stack. In the described exemplary embodiment, the semiconductor layers forming the oxide aperture contain an Al concentration of about 98%. The oxide aperture 120 is preferably doped with a dopant type that is the same as the mirror layer immediately adjacent to the oxide aperture. Thus, in the described exemplary embodiment the oxide aperture between the active region and the p-type upper mirror stack is preferably p-type with a carbon dopant at a concentration of about $1 \times 10^{17}$ $cm^{-3}$ to $1 \times 10^{19}$ $cm^{-3}$.

The alternate structure also includes the highly conductive current spreading layer 122 comprising a carbon doping spike at a concentration of about $1 \times 10^{20}$ $cm^{-3}$ above the oxide aperture as previously described with regards to the VCSEL of FIG. 2. The current spreading layer again provides a more uniform current distribution across the oxide aperture improving current injection into the active region thereby reducing the device resistance. The alternate VCSEL structure further includes the 75% aluminum transition layer 124 and a twenty three period p-type upper mirror stack as described with regards to FIGS. 2 and 4.

Figure 15:
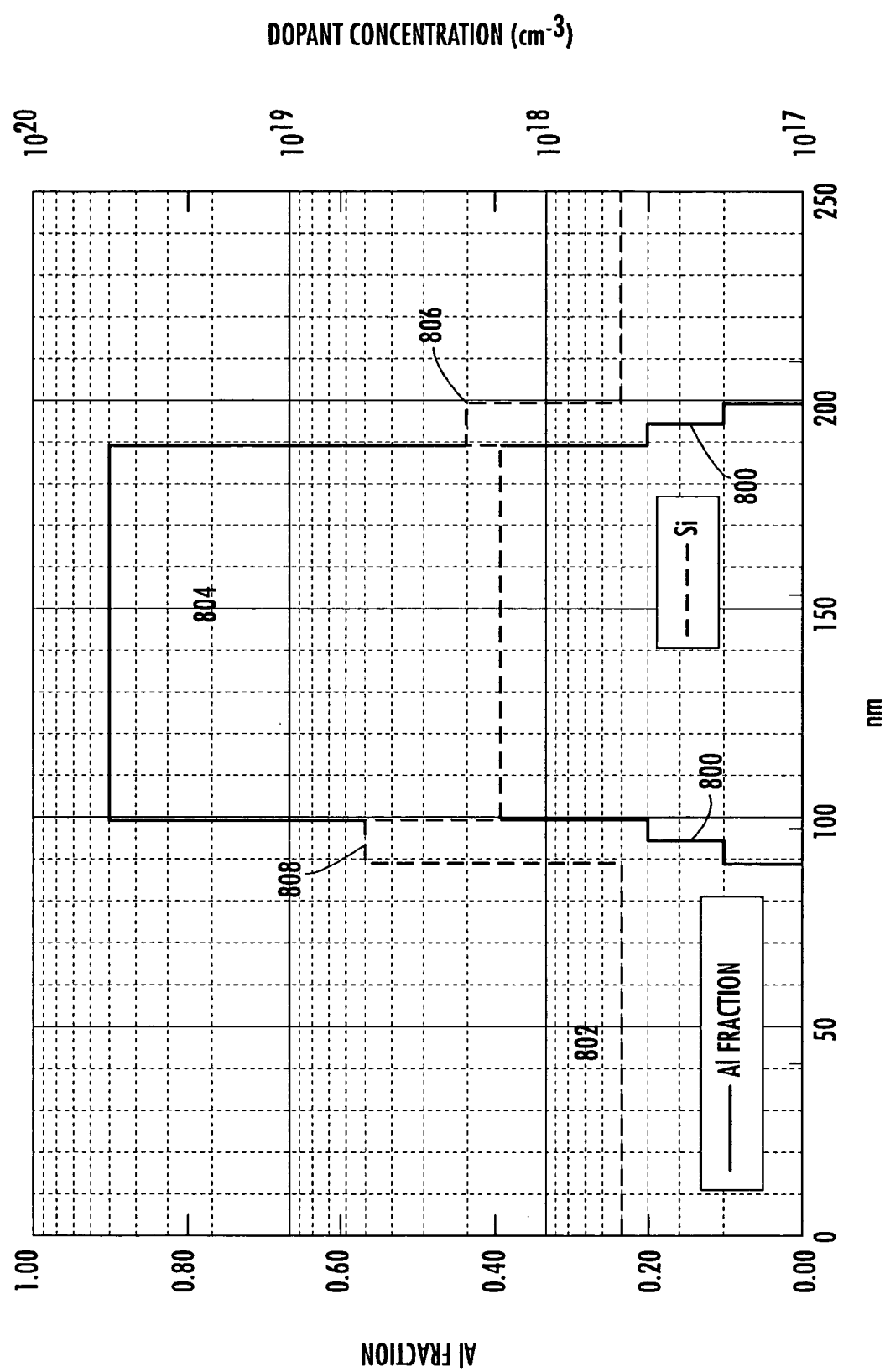
FIG. 15 graphically illustrate the alloy composition and doping levels of an exemplary n-type mirror stack of the VCSEL of FIG. 13 in accordance with an exemplary embodiment of the present invention.

The structural details, including alloy compositions and doping levels, of an exemplary n-type lower mirror stack, from the center of one GaAs layer to the center of the next GaAs layer, are shown in FIG. 15. An exemplary n-type lower mirror stack 714 (FIG. 13) may be designed to reduce heterojunction energy band discontinuities between adjacent semiconductor layers due to offsets in the conduction band, or a valence band or both. The reduction in band discontinuities reduces the voltage drop across the n-type lower mirror stack leading to lower power dissipation and reduced device heating.

In an exemplary embodiment of the present invention, a step graded interface 800 may be included between the high and low index layers, 802 and 804 respectively, in the lower n-type mirror stack to reduce heterojunction energy band discontinuities between adjacent semiconductor layers. An exemplary step graded interfacial transition layer for an AlGaAs/GaAs material system may comprise, for example, a 2–8 nm thick layer formed from $Al_xGa_{1-x}As$ with an aluminum composition ranging from about $0.05<x<0.15$. The described exemplary step graded interfacial transition layer may further comprise a second 2–8 nm thick layer formed from $Al_yGa_{1-y}As$ with an aluminum composition ranging from about $0.15<y<0.25$. One of skill in the art will appreciate that the aluminum composition in the transition layer may vary in accordance with material composition of the alternating layers in the DBR. Therefore, the disclosed compositional ranges are by way of example only and not by way of limitation.

In accordance with an exemplary embodiment the combined thickness of the two transition layers is in the range of about 6–12 nm. In an exemplary embodiment, the thickness of the high and low index layers are reduced to accommodate the thickness of the step graded interface in order to optimize the reflectivity of the DBR.

In the described exemplary embodiment the transition layer may be doped with a suitable n-type dopant such as for example silicon. In an exemplary embodiment the doping level is approximately 2–6 times the average doping level of the alternating high and low index layers. For example, in an exemplary embodiment the step graded interface may be Si doped with a donor concentration on the downward grade 806 of approximately $2 \times 10^{18}$ $cm^{-3}$ and a donor concentration on the upward grade 808 of approximately $5 \times 10^{18}$ $cm^{-3}$.

The doping levels of the described exemplary n-type lower mirror are preferably chosen to provide a substantially constant conductivity across the mirror layers. As is known in the art the conductivity of a semiconductor material is a function of the doping concentration and mobility whereas loss is simply a function of the number of free carriers. The mobility in the $Al_{0.90}Ga_{0.10}As$ is less than the mobility in the GaAs and therefore $Al_{0.90}Ga_{0.10}As$ has a lower conductivity for a given doping concentration. Therefore, for a given conductivity the $Al_{0.90}Ga_{0.10}As$ mirror layers 804 may be more heavily doped than the GaAs mirror layers 802 to reduce the resistance across the mirror without incurring an increase in the loss in the high mobility GaAs layer. In the described exemplary embodiment, the low index $Al_{0.94}Ga_{0.06}As$ layers are Si doped with a donor concentration of about $1.5 \times 10^{18}$ $cm^{-3}$. The high index GaAs layers may be doped with a suitable n-type dopant such as, for example, Si at a density of about $5 \times 10^{17}$ $cm^{-3}$.

Such concepts are described more fully in U.S. patent application Ser. No. 09/996,009, filed Nov. 28, 2001, entitled "LOW ELECTRICAL RESISTANCE N-TYPE MIRROR FOR OPTOELECTRONIC DEVICES", which is hereby incorporated by reference for all purposes as if set forth in its entirety.

Figure 16:
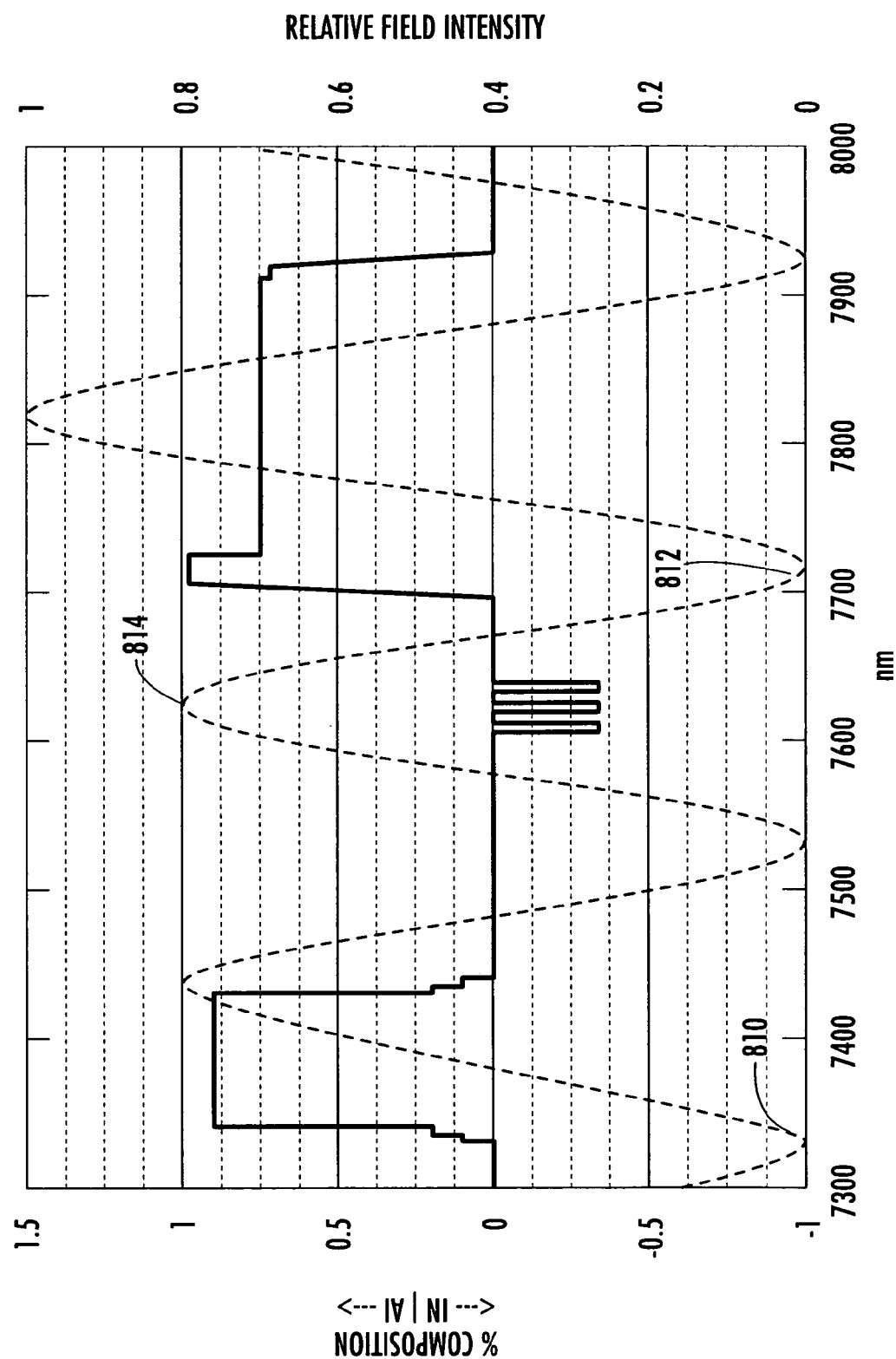
FIG. 16 graphically illustrates the alloy composition of that portion of the VCSEL structure shown in FIG. 14, overlayed with the standing wave intensity profile of the optical field as a function of vertical position within the VCSEL in accordance with an exemplary embodiment of the present invention.
Figure 17:
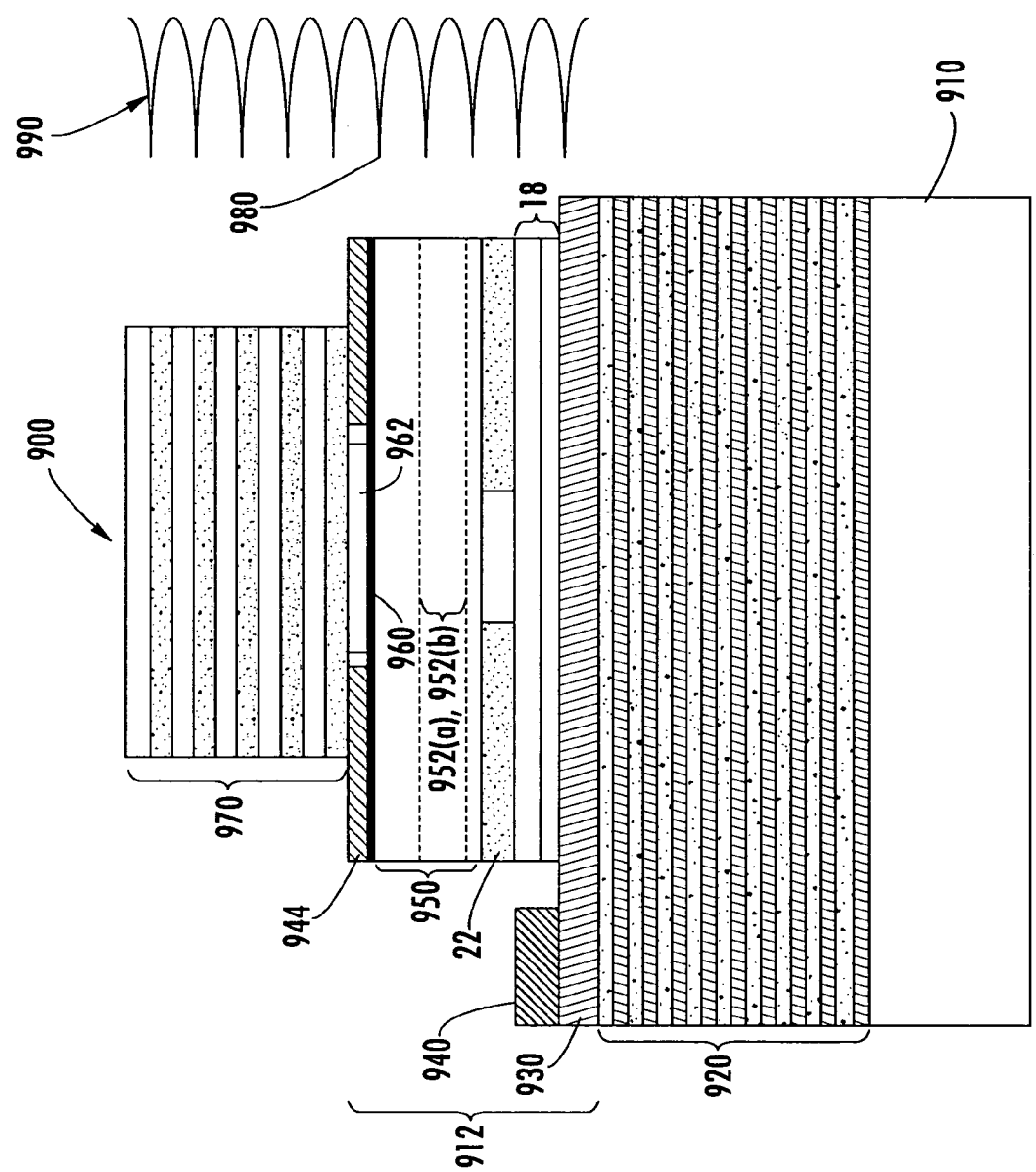

FIG. 16 displays the alloy composition of that portion of the VCSEL structure shown in FIG. 14, overlayed with the standing wave intensity profile of the optical field as a function of vertical position within the alternate VCSEL structure. In the alternate VCSEL structure, the heavily doped n-type regions are located at a node in the standing wave pattern of the VCSEL structure to reduce the loss associated with these heavily doped regions.

For example, the n-type doping spike located on the upward grade of the n-type lower mirror may be positioned at or near a node 810 in the standing wave intensity pattern of the VCSEL structure. Further, the heavily doped oxide aperture and current spreading layer are again located at or near a node 812 in the standing wave intensity pattern of the VCSEL structure to reduce the loss associated with the doped regions. In the alternate structure the quantum-well layers may again be positioned near an antinode 814 of the electric field of the light in the optical cavity to increase the efficiency for light generation therein.

Figure 17:
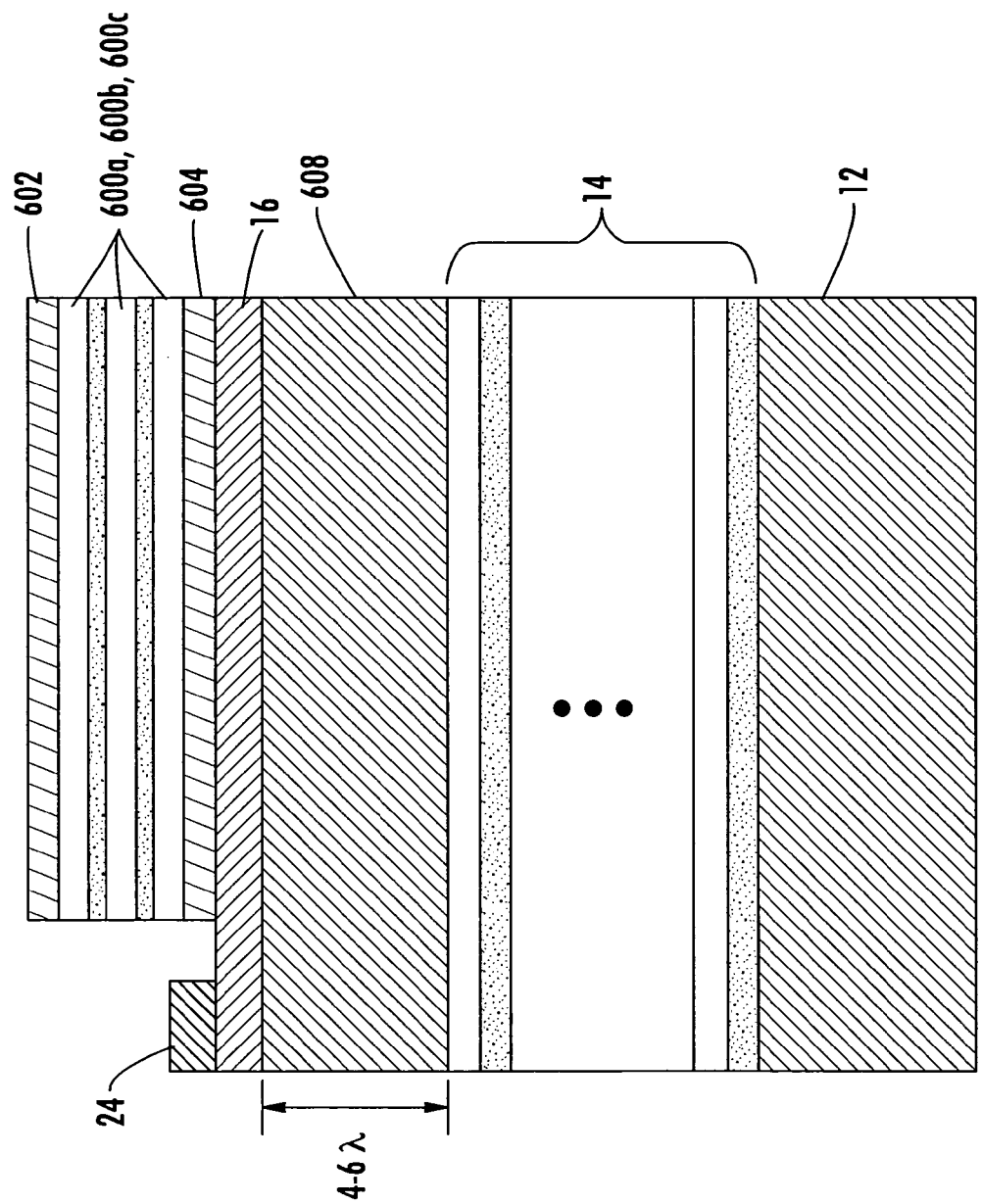
FIG. 17 is a cross-sectional view of a VCSEL having a p-type intra-cavity contact and an n-type intra-cavity contact in accordance with an exemplary embodiment of the present invention.

The optical loss, resistance and temperature performance of an exemplary long wavelength VCSEL may be further improved by integrating non-conductive upper and lower mirrors with upper and lower intra-cavity contacts. For example, referring to FIG. 17, in an exemplary embodiment an un-doped lower mirror 920 may be formed above a semi-insulating substrate 910. In this embodiment an n-type contact stack 930 may be formed above the lower mirror 920 and below an active region 18. In accordance with an exemplary embodiment, an oxide aperture 22 may be formed above the active region 18 and below a p-type contact stack 950. A non-conductive upper mirror 970 may be formed adjacent the p-type contact stack 950.

In the described exemplary embodiment the VCSEL layers are etched downward to an upper surface of the n-type contact stack 930 forming a mesa to provide access to the oxidation layer and the n-type contact stack. One of skill in the art will appreciate that the orientation and type of materials forming the VCSEL may be varied depending on the design. Therefore, the disclosed VCSEL is by way of example only and not by way of limitation.

In accordance with an exemplary embodiment VCSEL 900 may be electrically contacted with an n-type intra-cavity contact 940 and a p-type intra-cavity contact 944 that directly inject electrons and holes into the optical cavity. The described exemplary VCSEL therefore avoids electrical current conduction through the upper and lower mirrors, which reduces the series voltage drop across the VCSEL. In addition, the upper and lower mirrors may be un-doped non-conductive mirrors reducing the volume of lossy material within the device as well as the optical loss of the device.

In the described exemplary embodiment the lower mirror stack 920 may again comprise alternating layers of un-doped binary pairs of AlAs and GaAs with abrupt interfaces at the layer edges. The upper mirror 970 may comprise a dielectric DBR formed from alternating one-quarter wavelength thick layers of a high index of refraction dielectric material and a low index of refraction dielectric material such as for example silicon nitride and silicon dioxide respectively.

As previously described with respect to the VCSEL structure of FIG. 2, the alternate VCSEL comprises an active region 18 comprising a carrier confinement layer, one or more undoped InGaAsN quantum wells separated by GaAs barrier layers, and another carrier confinement layer. The illustrated carrier confinement layers may be replaced or combined with separate confinement heterostructures (SCHs). Fractionally, the In may range from about 0.3–0.4, and the Nitrogen may range from greater than 0.01 to less than about 0.02 in the quantum wells.

In an exemplary alternate embodiment, the active region may again comprise three $In_{0.34}Ga_{0.66}As_{0.988}N_{0.012}$ quantum wells, with barrier layers surrounding and separating the quantum wells. The barrier layers may have an energy bandgap intermediate between the energy bandgaps of the quantum-wells and the oxidation aperture and lower mirror stack. The quantum-wells provide quantum confinement of electrons and holes therein to enhance recombination for the generation of the light.

In the described exemplary alternate VCSEL structure, the oxide aperture 22 is again formed above the active region as previously described with respect to the VCSEL of FIG. 2. In accordance with an exemplary embodiment, the semiconductor layers forming the oxide aperture contain an Al concentration of about 98%. The oxide aperture 22 is preferably doped with a suitable p-type dopant such as for example carbon at a concentration in the range of about $5\times10^{17}$ cm$^{-3}$ to $1\times10^{20}$ cm$^{-1}$.

In the described exemplary embodiment the p-type contact stack provides lateral conduction of holes into the active region to cause lasing. The p-type contact stack 950 may be bulk doped with a suitable p-type dopant, such as, for example, Carbon or Berillium at a relatively low density. For example in an exemplary embodiment the p-type contact stack may have a dopant concentration in the range of about $5\times10^{16}$–$1\times10^{18}$ cm$^{-3}$, to reduce absorption of light therein.

In one embodiment, the p-type contact stack 950 may further comprise one or more p-type doping spikes 952(a) and 952(b) located at or near nulls in the optical standing wave intensity pattern 990. In the described exemplary embodiment the p-type doping spikes 952(a) and 952(b) may have a thickness equal to or less than about 30 nm, and are separated by a thickness of .lambda./2n, where n is the index of refraction of the p-type contact stack.

In the described exemplary embodiment the dopant concentration of the p-type doping spikes 952(a) and 952(b) may be in the range of about $2\times10^{19}$–$2\times10^{20}$ cm$^{-3}$. Advantageously, the placement of the p-type doping spikes, at or near the standing wave nodes where the optical losses are near zero, provides lateral conduction or current spreading from the p-type intra-cavity contact with reasonable resistance, without significantly compromising the optical efficiency. One of skill in the art will appreciate that the p-type doping spikes in the p-type contact stack may not be necessary in some designs where device resistance is not a limiting constraint.

In the described exemplary embodiment, the bulk doped p-type material of the p-type contact stack 950 has a relatively low dopant concentration. Therefore, the p-type contact stack may not have sufficient conductivity to provide a low resistance intracavity contact 944. In addition at high currents oxide confined VCSELs tend to develop non-uniform current distribution with "current crowding" at the edges of the high resistivity or oxidized portion of the aperture.

Therefore, an exemplary VCSEL structure may also comprise an additional highly doped layer 960 as part of the p-type contact stack 950. The highly doped layer 960 is highly conductive, comprising a carbon doping spike at a concentration of about $2\times10^{19}$–$2\times10^{20}$ cm$^{-3}$, and a thickness equal to or less than 30 nm, similar to the p-type doping layers 952(a) and 952(b). The highly doped layer 960, either alone or in conjunction with the p-type doping layers 952(a) and 952(b), if present, provides a more uniform current distribution across the oxide aperture improving current injection into the optical cavity and further reducing the device resistance.

In a conventional mirror structure a low index of refraction dielectric mirror layer would be formed proximate the p-type contact stack and the upper mirror would terminate with a high index of refraction layer. In operation, the large step down in the index of refraction at the interface between the uppermost high index of refraction layer and free space creates a maximum in the optical standing wave at this interface. In addition, the alternating layers are typically stacked such that the maxima in the optical standing wave intensity are located at the high-to-low index steps as seen from the optical cavity to increase mirror reflectivity. Therefore, conventional structures also result in the formation of a maximum of the optical standing wave intensity pattern at the interface between the p-type contact stack and the dielectric upper mirror. Therefore, losses from the highly doped layer 960 and light scattering defects, such as for example non-smooth surfaces, are magnified in a conventional design.

In an exemplary embodiment of the present invention, a dielectric spacer layer 962 may therefore be formed adjacent to the p-type contact stack 950. In the described exemplary embodiment the dielectric upper mirror 970 may then be formed above the dielectric spacer layer 962.

The integration of the dielectric spacer layer 962 adjacent the p-type contact stack 950 functions to form a hybrid cavity. In accordance with an exemplary embodiment the undesirable interface between the p-type contact stack and the dielectric spacer layer is relocated to be at or near a null 980 in the standing wave intensity pattern 990. Therefore, in operation the optical wave has reduced interaction with the imperfections on the surface of the semiconductor material and experiences lower loss from the highly doped layer 960 formed thereon. Such concepts are described more fully in U.S. patent application Ser. No. 10/105,473 filed Mar. 25, 2002, entitled "HYBRID VERTICAL CAVITY LASER WITH BURIED INTERFACE", now, U.S. Pat. No. 6,618,414, which is hereby incorporated by reference for all purposes as if set forth in its entirety.

In the described exemplary embodiment the dielectric spacer layer 962 may be formed from the same material used to form the high index material component of the dielectric upper mirror. An exemplary dielectric spacer layer may have an optical thickness equaling one-fourth the wavelength of the light emitted by the device. However, additional dielectric material, having an optical thickness approximately equal to an integer multiple of one half of the wavelength of the light emitted in the optical cavity, may be added to the dielectric spacer layer without changing its function. The additional material may serve as an extension layer to form an extended hybrid cavity. The total thickness of the semiconductor portion of the hybrid cavity should then be adjusted so that the optical thickness of the entire hybrid cavity is an integral number of half-wavelengths.

In the described exemplary embodiment the dielectric spacer layer may be patterned and etched to provide access to the highly doped layer 960. In an exemplary embodiment the p-type intra-cavity contact 944 may be formed on the p-type contact stack before the formation of the mesa and patterned by an etching or lift off step. In this embodiment the p-type intra-cavity contact 944 may either be protected by an overlying layer deposited and patterned for use as an etch mask, or the p-type intra-cavity contact may form at least a part of the etch mask. Advantageously, the use of the annular p-type intra-cavity contact to define the outer walls of the mesa automatically aligns the center of the ohmic aperture with the center of the oxide aperture.

The p-type intra-cavity contact may be formed, for example, by depositing a p-type metalization, such as gold with 2% beryllium added or a layered structure of titanium and platinum or titaniun/platinum/gold above the upper mirror stack defining an annular opening therein by a lithographic masking and lift-off process. The p-type intra-cavity contact may be deposited by electron beam evaporation.

In accordance with an exemplary embodiment, a mesa may be formed by etching a portion of the semiconductor layers of the VCSEL down to the n-type contact stack 930 by a wet or a dry etching process such as reactive ion etching (RIE), reactive ion beam etching (RIBE), or the like. In forming the mesa, the etch depth may be measured by reflectometry to precisely control the etch depth, and to allow the etch process to be stopped after etching down at least to the upper surface of the n-type contact stack. Advantageously, the etch may be performed prior to the formation of the upper mirror stack thereby reducing the depth of the etch. In the described exemplary embodiment the n-type intracavity contact 940 may be formed, for example, by depositing an n-type metalization such as AuGe/Ni/Au on the exposed upper surface of the n-type contact stack.

The oxidation aperture 22 may again be formed by placing the wafer into a container and heating the wafer to a temperature of about 350 to 500° C. under a controlled environment having a high humidity. Such a moist environment may be generated, for example, by flowing a gas, such as nitrogen, through water heated to about 80–95° C. to entrain water vapor, and then directing the moisture-laden gas into the container as previously described with respect to FIG. 1.

Figure 18:
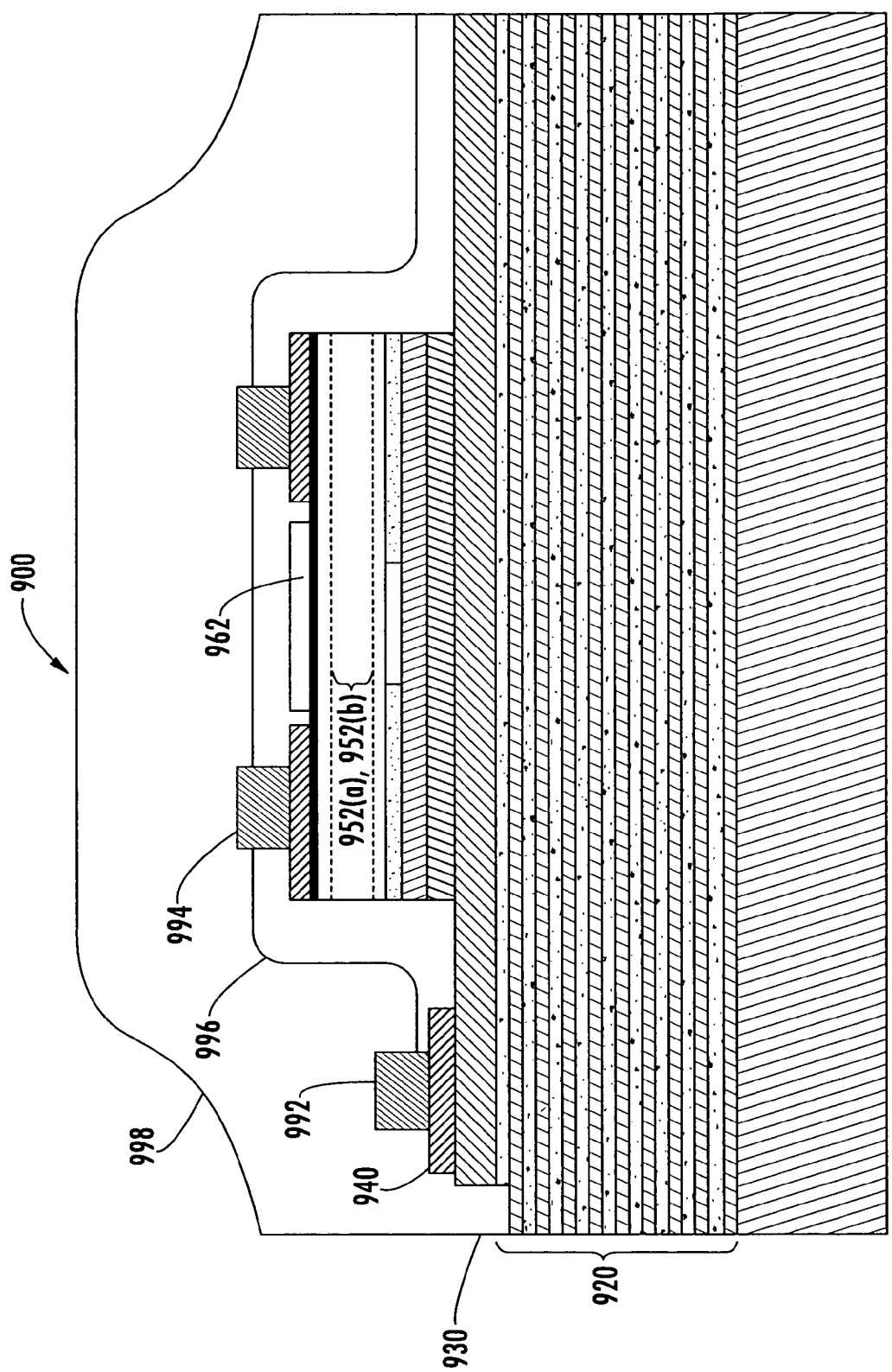
FIG. 18 is a cross-sectional view illustrating a method for contacting the VCSEL of FIG. 17 in accordance with an exemplary embodiment of the present invention.

Referring to FIG. 18, in the described exemplary embodiment, a second etch may be performed to remove a portion of the n-type contact stack 930 external to the n-type intra-cavity contact to isolate individual devices on the wafer. In addition at least a portion of undoped lower mirror may also be etched to provide a high resistivity contact area for interconnect leads. In an exemplary embodiment of the present invention interconnect metalizations 994 and 992 may be formed to electrically couple the p-type and n-type intra-cavity contacts 944 and 940 respectively to wire bond pads (not shown) formed on the highly resistive undoped mirror/substrate contact area. The highly resistive semi-insulating substrate and undoped lower mirror stack substantially reduce the parasitic capacitance typically associated with the metal leads and bond pads of a VCSEL and increase the maximum operating data rate as previously described with respect to FIG. 1.

The mesa formed to expose the oxide aperture to an oxidizing agent and to provide a high resistivity contact area complicates the approach to coupling an interconnect metal to the p-type intra-cavity contact formed on the p-type contact stack for current transport into the optical cavity. The described exemplary VCSEL may utilize a single period 996 of the dielectric upper mirror to form a ramp from the top of the mesa to the high resistivity planar area adjacent to the mesa. The interconnect metalization may then be formed on the dielectric mirror period to couple the bond pad to the p-type intra-cavity contact. In this embodiment the utilization of the p-type intra-cavity contact reduces the height of the mesa and the associated ramp required to couple the bond pad to the p-type intra-cavity contact.

In the described exemplary embodiment the remaining upper mirror periods 998 may then be formed over the entire upper surface of the wafer. The dielectric upper mirror passivates the etched mesas and exposed semiconductor layers. Vias may be formed in the upper mirror to provide access to the bond pads (not shown) for contacting the device.

Figure 19:
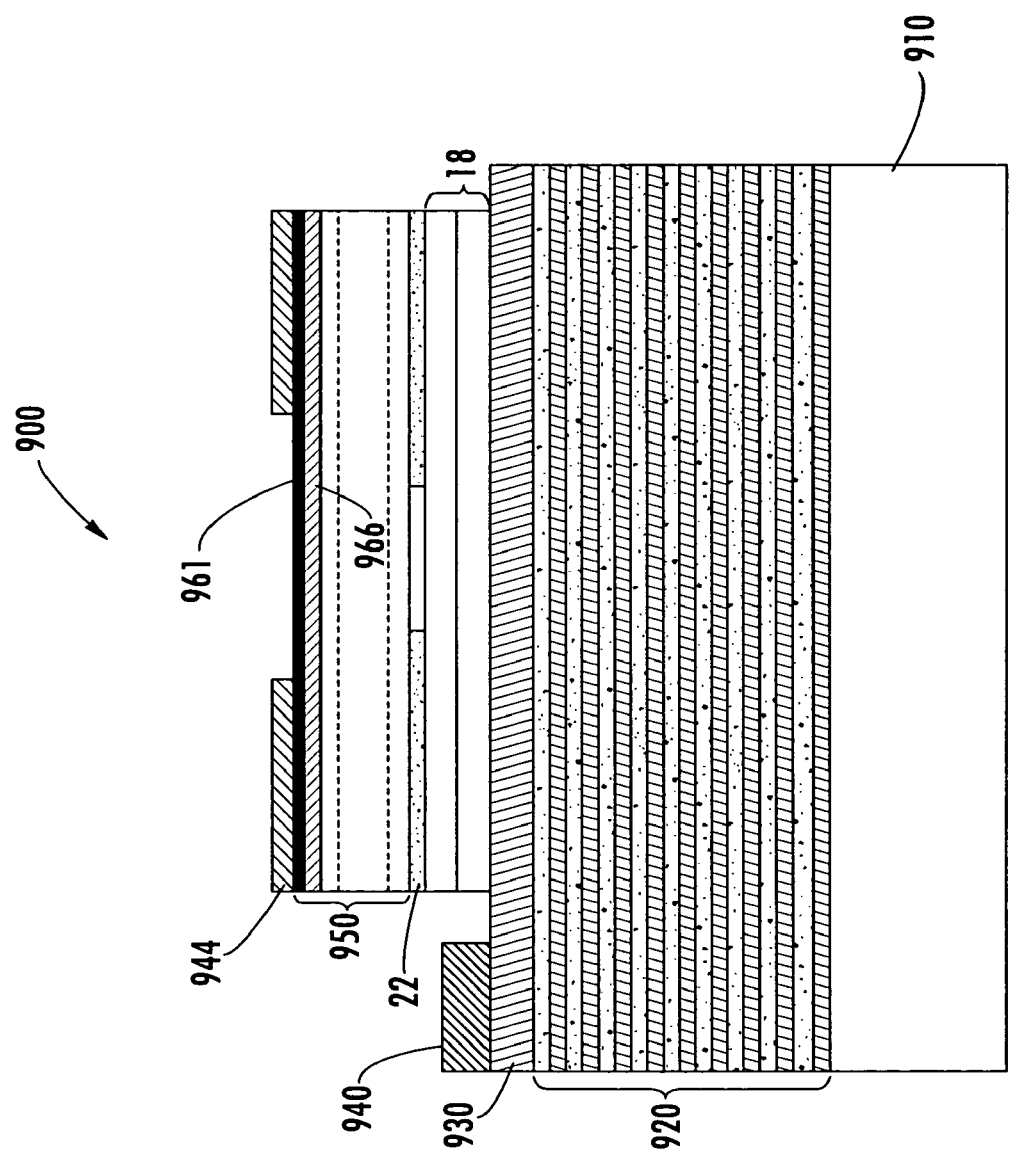
FIG. 19 is a cross-sectional view of a VCSEL utilizing an etch stop layer to selectively remove a highly doped p-type contact stack from within the ohmic aperture in accordance with an exemplary embodiment of the present invention.

One of skill in the art will appreciate that alternative methods may be utilized to contact the described exemplary VCSEL. For example, referring to FIG. 19, in one embodiment an etch stop layer 966 may be deposited above the p-type contact stack 950 and a highly doped p-type contact layer 961 may be formed above the etch stop layer 966. In the described exemplary embodiment both the etch stop layer and p-type contact layer are doped with a p-type dopant at a density greater than about $1 \times 10^{19}$ cm$^{-3}$.

Figure 20:
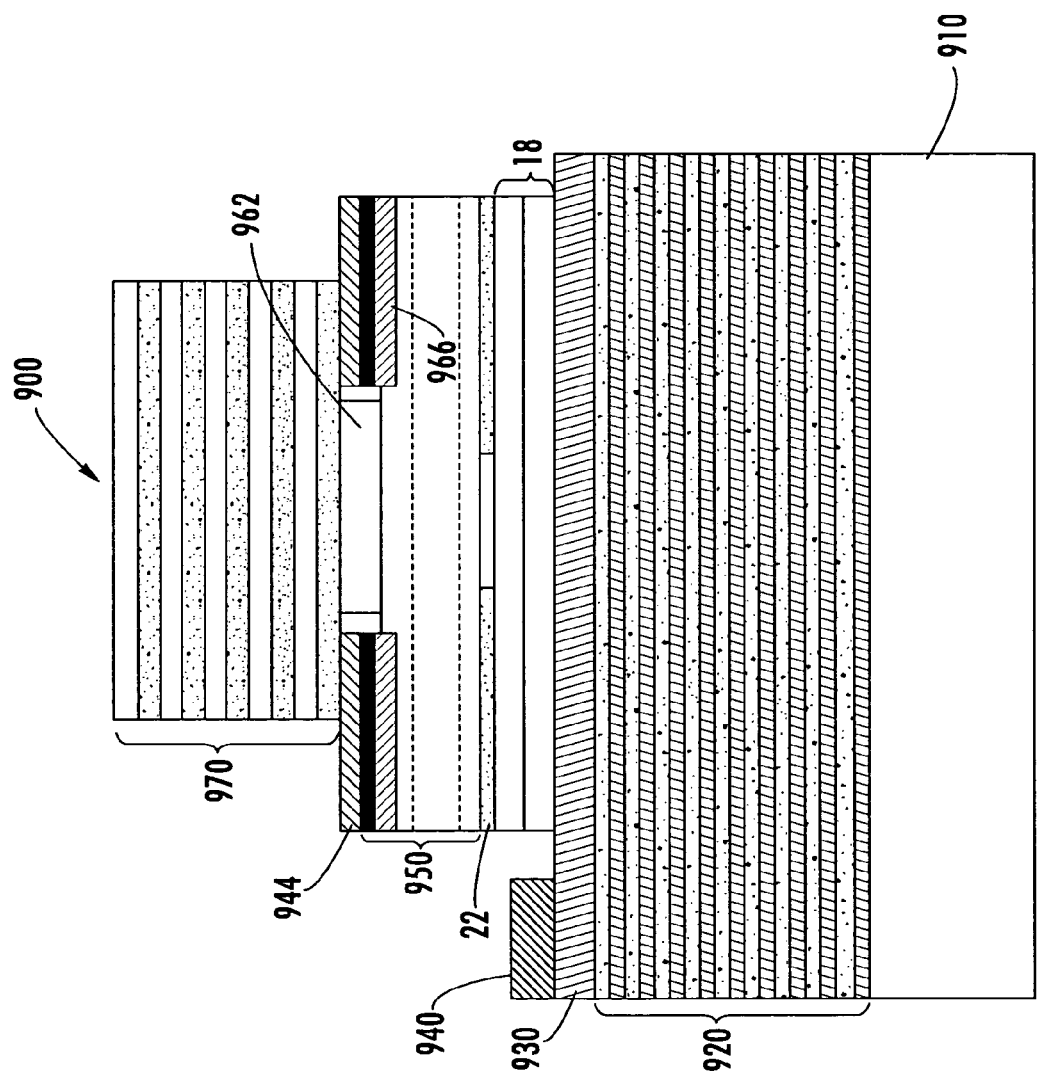
FIG. 20 is a cross-sectional view of the VCSEL of FIG. 19 following exemplary processing steps in accordance with an exemplary embodiment of the present invention.

The p-type intra-cavity contact 944 may then be formed on the more heavily doped p-type contact layer 961. After the intra5 cavity contact 944 is formed on the p-type contact layer 961 the remaining exposed portion of the p-type contact layer 961 within the ohmic aperture may be selectively etched down to the AlAs etch stop layer 966 using, for example, a citric acid-based etchant (see FIG. 20). The underlying AlAs etch stop layer 966 may then be selectively removed down to the uppermost surface of the p-type contact stack 950 with a suitable etchant, such as, for example, a solution of hydrochloric acid, with ten percent water. In this embodiment the doping density in the doping spikes within the p-type contact stack may be increased to provide lateral conduction from the p-type intra-cavity contact 944 with reasonable resistance. In this embodiment, it still may be beneficial to integrate a dielectric spacer layer to minimize scattering that might be associated with surface roughening that may result from the etch back processing step.

One of skill in the art will further appreciate that an alternate etch back procedure may also be used to electrically contact a current spreading layer or doping spike within the p-type contact stack. In this embodiment a lithographic masking and liftoff process may be used to electrically contact highly doped p-type layers. For example, in one embodiment a multi-layer photoresist may be deposited across the upper surface of the p-type contact stack, patterned and etched prior to the deposition of the p-type intra-cavity contact on a doping spike within the p-type contact stack.

Although exemplary embodiments of the present invention have been described, they should not be construed to limit the scope of the appended claims. Those skilled in the art will understand that various modifications may be made to the described exemplary embodiments. For example, the features of the described exemplary VCSEL structures may be combined in a variety of different manners to form low loss high performance long wavelength VCSEL.

For example, an exemplary VCSEL may include a conductive substrate and conductive lower mirror with an intra-cavity upper ohmic contact and dielectric upper mirror. In addition, light emitting devices such as vertical cavity surface emitting lasers (VCSELS) are often manufactured in the form of arrays, wherein the devices are epitaxially grown on a single substrate, processed and auto-tested as a whole wafer. Further, an array of surface emitting lasers enables relatively high density alignment with a high coupling coefficient into an array of optical fibers.

Conventionally, individual devices within an array may be defined by implanting protons in the form of an annular isolation region that confines current flow within the individual VCSEL devices, while also electrically isolating each device from the other VCSEL devices in the array. However, in the case of long wavelength VCSELs employing a mesa structure, the thickness of the upper mirror may exceed the maximum depth to which hydrogen or other ions may be reasonably implanted.

Figure 21:
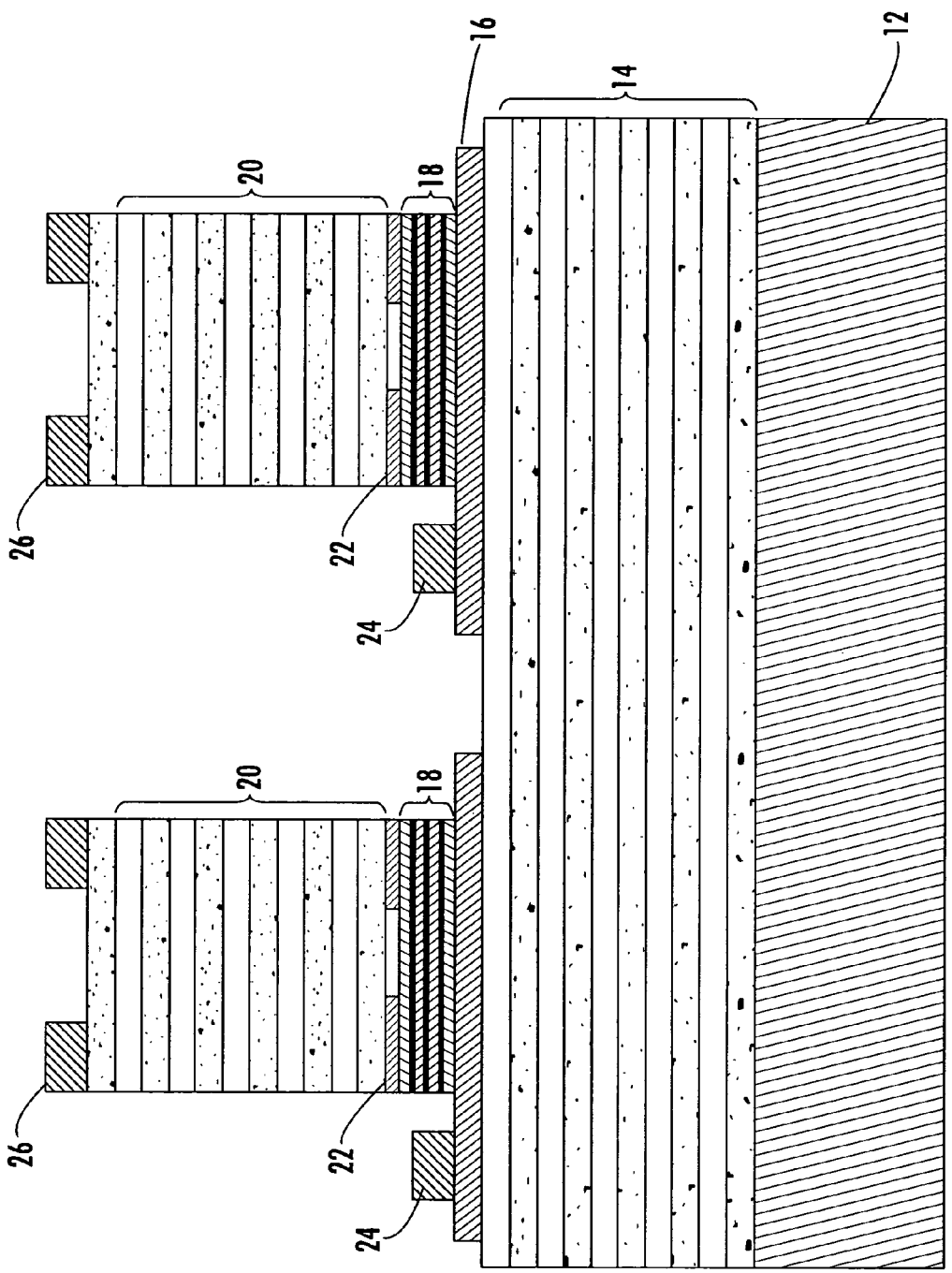
FIG. 21 is a cross-sectional view of linear array of VCSEL devices in accordance with an exemplary embodiment of the present invention.

Referring to FIG. 21, advantageously the semi-insulating substrate VCSEL embodiment may be readily formed into an array of monolithic VCSELs without the need for ion implant isolation regions. In fact the mesa etch (see FIG. 7B) and isolation etch (see FIG. 7E) inherently provide the current confinement and device isolation required to form a VCSEL array.

Figure 22:
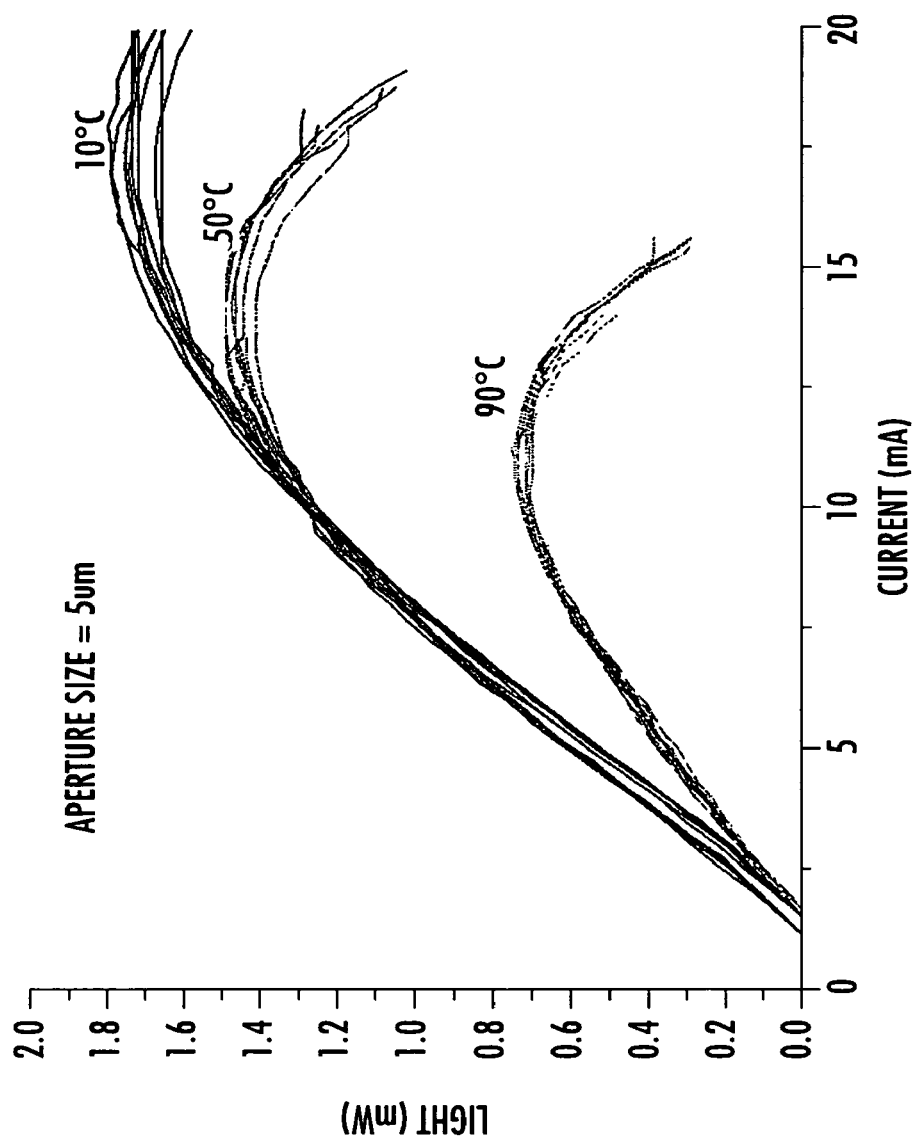
FIG. 22 is a light intensity diagram graphically illustrating the performance of a linear array of twelve VCSELs over temperature in accordance with an exemplary embodiment of the present invention.

In addition, FIG. 22 graphically illustrates the DC light intensity (LI) curves of an exemplary 12-element array at three different temperatures. The linear array has a device-to-device spacing of approximately 250 µm, and each device is single-mode with a 5 µm diameter oxide aperture 22. The linear array provides a substantially uniform light output at a given current and temperature and may be utilized as a source for parallel optical links using standard MTP parallel connectors.

Figure 23:
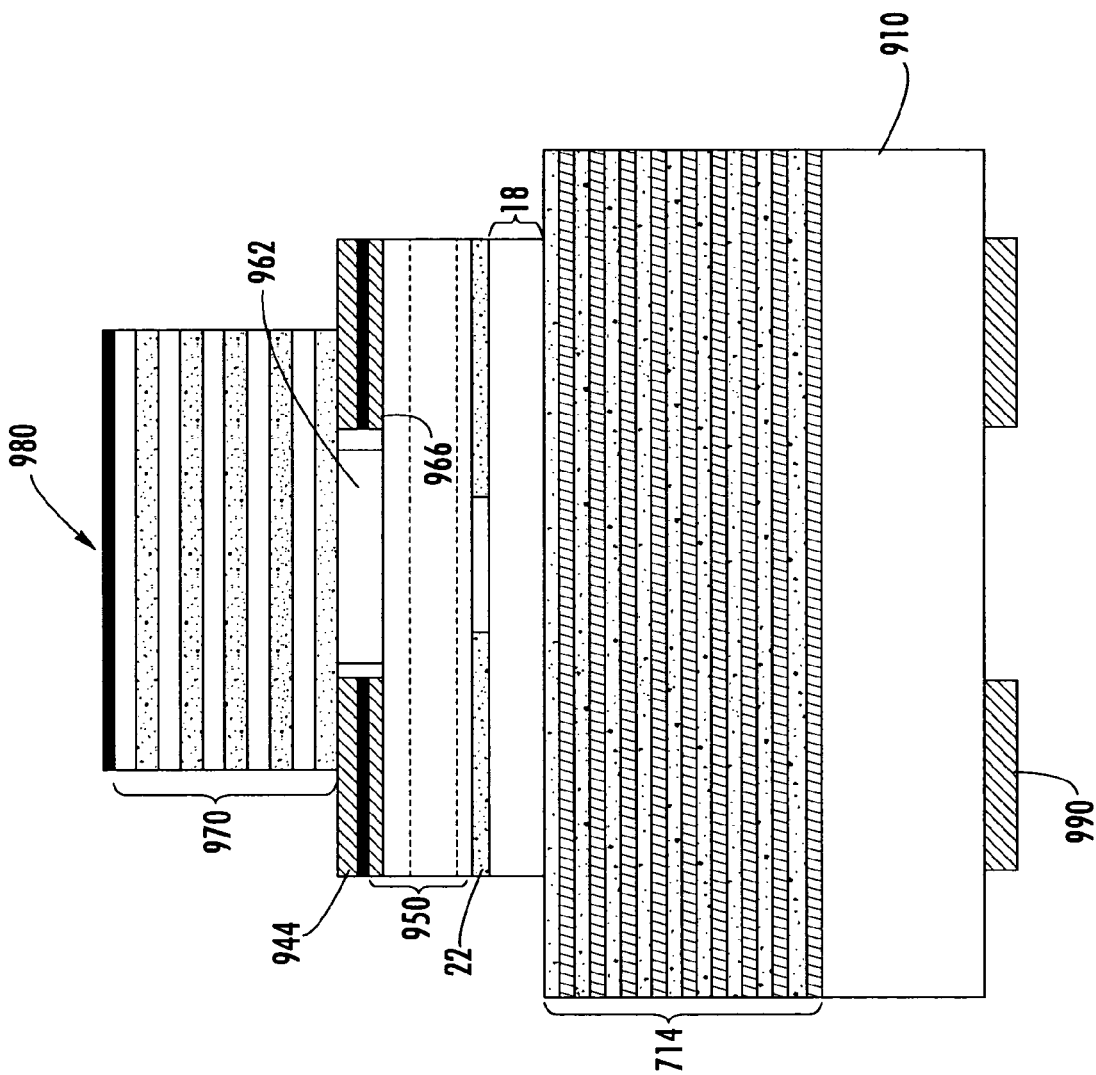
FIG. 23 is a cross-sectional view of a bottom emitting long wavelength VCSEL having a low electrical resistance n-type lower mirror formed on a GaAs substrate.

One of skill in the art will appreciate that the present invention may be configured as a back emitting structure for use in flip chip mounted applications. Referring to the cross section of FIG. 23, in an exemplary embodiment the GaAs substrate 910 is substantially transparent at wavelengths greater than about 1.0 µm. Therefore, the described exemplary VCSEL may operate as either a top or bottom emitter depending upon the exact reflectivity of the top and bottom mirrors, with the ability to monitor the transmitted output power of the VCSEL from light emitted through the opposite mirror.

The alternate approach of FIG. 23, again includes a GaAs substrate 910 with a low loss, low resistance n-type lower mirror 714, as described with respect to FIGS. 13 and 15, epitaxially grown on the substrate 910. In the alternate embodiment a compound semiconductor active region 18 may be epitaxially grown on the lower mirror 714. The active region again includes one or more InGaAsN quantum-wells surrounded by barrier layers as may be preferable for the formation of a VCSEL device. In the alternate VCSEL structure, the oxide aperture 22 may again be formed above the active region as previously described with respect to the VCSEL of FIG. 20. In addition, the optical cavity may again include the p-type contact stack 950 having heavily doped spikes located at or near nulls in the optical standing wave intensity pattern.

The described exemplary embodiment may again comprise a p-type intra-cavity contact 944 formed on the heavily doped p-type contact layer 961. The bottom emitter structure may include the AlAs etch stop layer 966 that allows for the selective removal of heavily doped p-type contact the 961 from within the ohmic aperture as described with respect to FIG. 20. One of skill in the art will appreciate however that the dielectric spacer layer as described in FIG. 18 may also be used.

In accordance with an exemplary embodiment, the upper mirror 970 may comprise a dielectric DBR formed from alternating one-quarter wavelength thick layers of a high index of refraction dielectric material and a low index of refraction dielectric material such as for example silicon nitride and silicon dioxide respectively.

In an exemplary embodiment of the present invention a metal layer 980 may be deposited on the upper most surface of the dielectric upper mirror 970 to increase the overall reflectivity of the upper mirror. The described exemplary metal/dielectric mirror has a reflectivity of at least 99% and preferably has a reflectivity on the order of about 99.8%. In accordance with an exemplary embodiment the metal layer 980 above the upper mirror is sufficiently thick to prevent transmission of the lasing light so that the described exemplary VCSEL is a bottom emitter.

In this embodiment the reflectivity of the lower mirror may be decreased as compared to an upper emission device by using fewer mirror pairs. In addition, in the described exemplary embodiment the lower surface of the substrate may be polished and coated with an anti-reflective coating to reduce coupled cavity effects. In addition, a contact metalization may be deposited on the lower surface of the substrate, forming an n-type lower ohmic contact 990. The n-type lower ohmic contact 990 forms an annular aperture and may comprise, for example, AuGe/Ni/Ge deposited by electron beam evaporation or sputtering.

One of skill in the art will appreciate that the present invention is not limited to the described exemplary backside emission structure. Rather a variety of suitable VCSEL structures may be used to provide bottom side emission. For example, in an alternate embodiment a low loss p-type upper mirror may be used in conjunction with a p-type upper ohmic contact as described with respect to FIGS. 1 and 4. In this embodiment, the metal layer deposited above the p-type upper mirror allows for the reduction of the number of p-type mirror periods in the upper mirror, reducing the loss associated with the upper mirror as compared to a top emitting structure.

Figure 24:
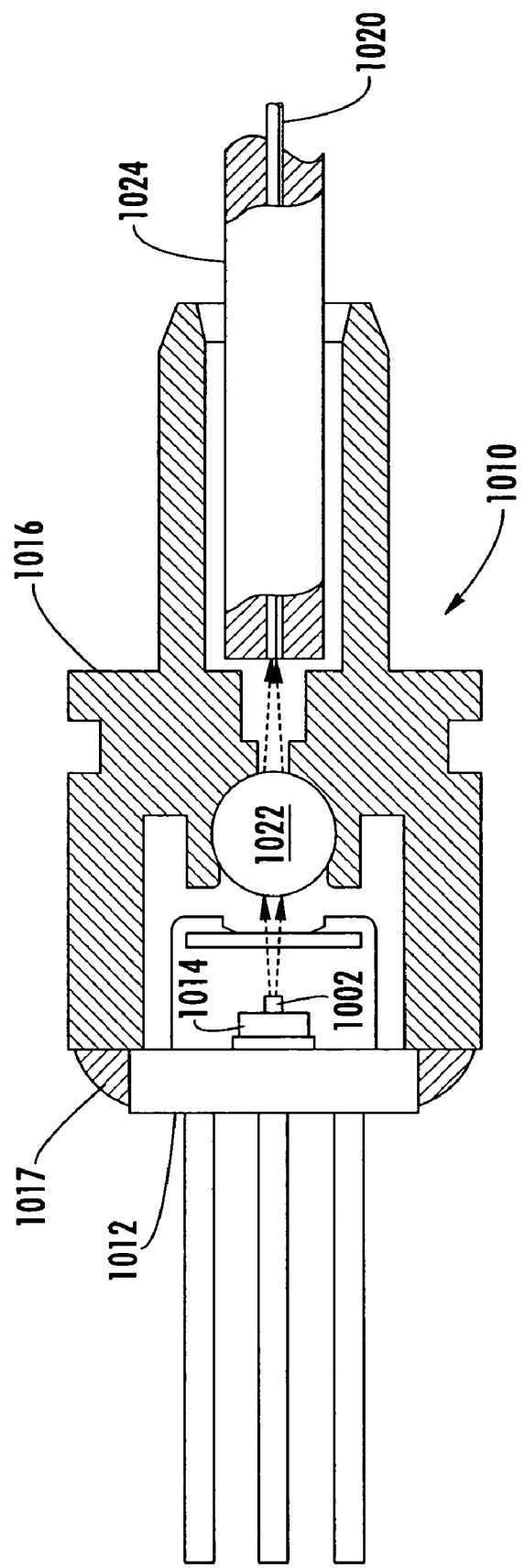
FIG. 24 is a side view, partly in cross-section, of an optical subassembly incorporating the long wavelength VCSEL in accordance with an exemplary embodiment of the present invention.

FIG. 24 illustrates the integration of an exemplary VCSEL 1002 as illustrated in FIGS. 1, 13, 17, 20 or 23, mounted into an optical subassembly (OSA) 1010. The OSA enables application of DC biasing and AC modulation signals to the VCSEL. The OSA generally comprises an electrical package 1012 containing the VCSEL 1002 and a power monitoring photodetector 1014.

The electrical package may be bonded to a precision molded plastic housing 1016. The bonding process including conventional bonding material 1017 may involve active alignment to optimize the coupling of the laser light into an optical fiber 1020, as is conventional in the art. The described exemplary OSA may include a focusing element, such as, for example, a ball lens 1022 for coupling the light into the optical fiber. A ferule 1024 provides alignment of the optical fiber. After the electrical package 1012 and housing 1016 are bonded together, the fiber is removed and the OSA 1010 is complete. An exemplary optical subassembly is also described in U.S. patent application Ser. No. 08/900,507, filed Jul. 25, 1997, the contents of which are hereby incorporated by reference.

The described exemplary long wavelength VCSEL enables extended distances and data rates to be realized over single mode optical fiber. The described exemplary VCSEL will therefore provide significant cost reductions making increased bandwidth more accessible and cost effective for the telecommunications and Internet infrastructure.

Although exemplary embodiments of the present invention have been described, they should not be construed to limit the scope of the appended claims. Those skilled in the art will understand that various modifications may be made to the described embodiments. For example, an ion implant may be utilized in lieu of an oxide aperture to provide a current constriction for transverse mode control.

Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A vertical cavity surface emitting laser, comprising:
a substrate;
an n-type mirror adjacent said substrate,
said n-type mirror comprising alternating layers of a first semiconductor material having a first index of refraction and a second semiconductor material having a second index of refraction greater than said first index of refraction, and further comprising a step graded interfacial transition layer therebetween,
said step graded interfacial transition layer being doped n-type wherein a concentration of dopant in said step graded interfacial transition layer is about 2–6 times greater than concentration of dopant in said alternating layers of said n-type mirror;
an optical cavity comprising an active region having one or more $In_xGa_{1-x}As_yN_{1-y}$ quantum wells adjacent said n-type mirror;
a second mirror adjacent the optical cavity;
an upper electrode above the active region of the optical cavity; and
a lower electrode below the active region of the optical cavity.

2. A vertical cavity surface emitting laser, comprising:
a substrate;
an n-type mirror adjacent said substrate,
said n-type mirror comprising alternating layers of a first semiconductor material having a first index of refraction and a second semiconductor material having a second index of refraction greater than said first index of refraction, and further comprising a step graded interfacial transition layer therebetween,
said first material comprising $Al_xGa_{1-x}As$;
an optical cavity comprising an active region having one or more $In_xGa_{1-x}As_yN_{1-y}$ quantum wells adjacent said n-type mirror;
a second mirror adjacent the optical cavity;
an upper electrode above the active region of the optical cavity; and
a lower electrode below the active region of the optical cavity.

3. The vertical cavity surface emitting laser of claim 2 wherein said second material comprises $Al_yGa_{1-y}As$ wherein y is less than 0.3.

4. A vertical cavity surface emitting laser, comprising:
a substrate;
an n-type mirror adjacent said substrate,
said n-type mirror comprising alternating layers of a first semiconductor material having a first index of refraction and a second semiconductor material having a second index of refraction greater than said first index of refraction, and further comprising a step graded interfacial transition layer therebetween,
said step graded interfacial transition layer comprising a first transition layer comprising AlGaAs having a first concentration of Al and a second transition layer comprising AlGaAs having a second concentration of Al;
an optical cavity comprising an active region having one or more $In_xGa_{1-x}As_yN_{1-y}$ quantum wells adjacent said n-type mirror;
a second mirror adjacent the optical cavity;
an upper electrode above the active region of the optical cavity; and
a lower electrode below the active region of the optical cavity.

5. The vertical cavity surface emitting laser of claim 4 wherein said first concentration of Al ranges from about 5–15%.

6. The vertical cavity surface emitting laser of claim 5 wherein said second concentration of Al ranges from about 15–25%.

7. A vertical cavity surface emitting laser, comprising:
a substrate;
an n-type mirror adjacent said substrate, said n-type mirror comprising alternating layers of a first semiconductor material having a first index of refraction and a second semiconductor material having a second index of refraction greater than said first index of refraction and a step graded interfacial transition layer therebetween;

an optical cavity comprising an active region having one or more $In_xGa_{1-x}As_yN_{1-y}$ quantum wells adjacent said n-type mirror;

a second mirror adjacent the optical cavity, said second mirror comprising a dielectric mirror having alternating layers of a first dielectric material having a third index of refraction and a second dielectric material having a fourth index of refraction greater than said third index of refraction;

an upper electrode above the active region of the optical cavity; and a lower electrode below the active region of the optical cavity.

8. The vertical cavity surface emitting laser of claim 7 wherein said upper electrode comprising an intra-cavity contact.

9. The vertical cavity surface emitting laser of claim 8 wherein said optical cavity further comprises a delta doped cladding layer and wherein said intra-cavity contact is adjacent said delta doped cladding layer.

10. The vertical cavity surface emitting laser of claim 9 wherein said optical cavity further comprises a highly doped p-type layer adjacent said delta doped cladding layer and wherein said intra-cavity contact is adjacent said highly doped p-type layer.

11. A vertical cavity surface emitting laser, comprising:
a substrate;
an n-type mirror adjacent a first surface of said said substrate, said n-type mirror comprising alternating layers of a first semiconductor material having a first index of refraction and a second semiconductor material having a second index of refraction greater than said first index of refraction and a step graded interfacial transition layer therebetween;
an optical cavity comprising an active region having one or more $In_xGa_{1-x}As_yN_{1-y}$ quantum wells adjacent said n-type mirror;
a second mirror adjacent the optical cavity, said second mirror comprising alternating layers of a third semiconductor material having a third index of refraction and a fourth semiconductor material having a fourth index of refraction greater than said third index of refraction;
an upper electrode above the active region of the optical cavity; and
a lower electrode below the active region of the optical cavity.

12. The vertical cavity surface emitting laser of claim 11 wherein said alternating layers of said second mirror are doped p-type.

13. The vertical cavity surface emitting laser of claim 12 wherein said p-type second mirror comprises compositional grading of Al at heterojunction interfaces between said alternating layers.

14. The vertical cavity surface emitting laser of claim 13 wherein said lower electrode comprises an annular n-type ohmic contact adjacent a second surface of said substrate.

15. The vertical cavity surface emitting laser of claim 14 further comprising a conductive layer formed adjacent said second mirror wherein said vertical cavity surface emitting laser emits light through an aperture in said annular n-type ohmic contact.

16. The vertical cavity surface emitting laser of claim 15 wherein said second surface of said substrate is polished.

17. The vertical cavity surface emitting laser of claim 15 further comprising an anti-reflective coating adjacent said second surface of said substrate and wherein said n-type ohmic contact is adjacent said anti-reflective coating.

18. A vertical cavity surface emitting laser, comprising:
a substrate;
an n-type mirror adjacent said substrate, said n-type mirror comprising alternating layers of a first semiconductor material having a first index of refraction and a second semiconductor material having a second index of refraction greater than said first index of refraction and a step graded interfacial transition layer therebetween;
an optical cavity comprising an active region having one or more $In_xGa_{1-x}As_yN_{1-y}$ quantum wells adjacent said n-type mirror;
an oxide aperture formed above the active region by steam oxidation of an Al-containing semiconductor oxide layer.
a second mirror adjacent the optical cavity;
an upper electrode above the active region of the optical cavity; and
a lower electrode below the active region of the optical cavity.

19. The vertical cavity surface emitting laser of claim 18 wherein said oxide layer comprises AlAs.

20. The vertical cavity surface emitting laser of claim 18 wherein said oxide layer comprises AlGaAs and wherein aluminum composition in said oxide layer is greater than aluminum composition in semiconductor layers in the p-type second mirror.

21. The vertical cavity surface emitting laser of claim 18 further comprising a current spreading layer adjacent the oxide aperture.

22. The vertical cavity surface emitting laser of claim 21 wherein the oxide aperture and the current spreading layer are positioned at or near a node in optical standing wave intensity pattern of the vertical cavity surface emitting laser.

23. The vertical cavity surface emitting laser of claim 18 further comprising a p-type transition layer adjacent said oxide aperture having an aluminum composition that is less than aluminum composition of said oxide layer to ensure that oxidized portion of the oxide aperture maintains a predetermined oxide thickness.

24. The vertical cavity surface emitting laser of claim 18 wherein said second mirror comprises alternating layers of un-doped binary pairs of AlAs and GaAs.

* * * * *